(12) United States Patent
Sudo

(10) Patent No.: US 9,496,842 B2
(45) Date of Patent: Nov. 15, 2016

(54) ELECTRONIC DEVICE HAVING SOUND GENERATING UNIT WITH PIEZOELECTRIC ELEMENT CONFIGURED FOR VIBRATION AND VOLUME ADJUSTMENT, AND CONTROL METHOD AND CONTROL PROGRAM FOR THE ELECTRONIC DEVICE

(71) Applicant: KYOCERA CORPORATION, Kyoto-shi, Kyoto (JP)

(72) Inventor: Tomohiro Sudo, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 106 days.

(21) Appl. No.: 14/381,637

(22) PCT Filed: Apr. 25, 2013

(86) PCT No.: PCT/JP2013/062272
§ 371 (c)(1),
(2) Date: Aug. 28, 2014

(87) PCT Pub. No.: WO2013/164977
PCT Pub. Date: Nov. 7, 2013

(65) Prior Publication Data
US 2015/0043748 A1     Feb. 12, 2015

(30) Foreign Application Priority Data

May 2, 2012   (JP) .................................. 2012-105518

(51) Int. Cl.
*H04R 25/00*     (2006.01)
*H03G 7/00*      (2006.01)
(Continued)

(52) U.S. Cl.
CPC *H03G 7/00* (2013.01); *G08B 5/00* (2013.01); *H03G 5/16* (2013.01); *H04M 19/047* (2013.01);
(Continued)

(58) Field of Classification Search
None
See application file for complete search history.

(56) References Cited

U.S. PATENT DOCUMENTS 6,735,315 B1 *   5/2004   Ifukube ..................... A61F 2/20
                                                      381/70
2008/0112581 A1 *  5/2008   Kim ....................... H04R 1/1075
                                                     381/151

(Continued)

FOREIGN PATENT DOCUMENTS

JP   2005-348193 A   12/2005
JP   2011-205417 A   10/2011

OTHER PUBLICATIONS

Computer Translation of JP 2005-348193, Tamura et al, Dec. 15, 2005.*

(Continued)

*Primary Examiner* — Tan X Dinh
(74) *Attorney, Agent, or Firm* — Hauptman Ham, LLP

(57) ABSTRACT

According to an aspect, an electronic device includes: a piezoelectric element; a sound generating unit that is vibrated by the piezoelectric element and generates a vibration sound to be transmitted while vibrating part of a human body; and a detection unit that detects contact of the part of the human body with the sound generating unit. A volume of the vibration sound is changed corresponding to a detection result of the detection unit.

20 Claims, 23 Drawing Sheets

(51) Int. Cl.
*H04R 17/00* (2006.01)
*H04M 19/04* (2006.01)
*H04R 7/04* (2006.01)
*G08B 5/00* (2006.01)
*H03G 5/16* (2006.01)

(52) U.S. Cl.
CPC .............. *H04R 7/045* (2013.01); *H04R 17/00* (2013.01); *H04M 2250/22* (2013.01); *H04R 2400/03* (2013.01); *H04R 2430/01* (2013.01); *H04R 2460/13* (2013.01); *H04R 2499/11* (2013.01)

(56) References Cited

U.S. PATENT DOCUMENTS

| | | | | |
|---|---|---|---|---|
| 2009/0245556 | A1* | 10/2009 | Parker | H04R 25/70 381/326 |
| 2012/0253104 | A1* | 10/2012 | Andersson | H04R 25/604 600/25 |
| 2012/0289162 | A1* | 11/2012 | Hosoi | H04B 5/0006 455/41.3 |
| 2013/0259221 | A1* | 10/2013 | Shusaku | H04M 1/6016 379/390.01 |
| 2013/0260836 | A1* | 10/2013 | Tsunoda | H04M 1/0266 455/566 |
| 2015/0043750 | A1* | 2/2015 | Nabata | H04M 1/6016 381/103 |
| 2015/0104047 | A1* | 4/2015 | Izumi | H04M 1/03 381/162 |
| 2015/0117682 | A1* | 4/2015 | Fukami | B06B 1/0603 381/190 |
| 2015/0119109 | A1* | 4/2015 | Sudo | H04R 7/045 455/566 |
| 2015/0181338 | A1* | 6/2015 | Hosoi | H04R 5/033 381/309 |
| 2015/0256656 | A1* | 9/2015 | Horii | H04M 1/0202 455/575.1 |

OTHER PUBLICATIONS

Osamu Sonobe, "KDDI to Kyocera, 'Onsei Shindo Soshi' o Tosai shita 'Shin Chokaku Smartphone' o Shisaku", ITmedia Mobile, ITmedia, Sep. 27, 2011.

International Search Report mailed Jun. 11, 2013, in corresponding International Application No. PCT/JP2013/062272.

EE Times Japan, "—Transmits sound through vibration of the housing—KDDI showcased New Auditory Sensation Smartphone" ,[online], Oct. 5, 2011 [searched on Dec. 22, 2015], Internet, <URL: http://eetimes.jp/ee/articles/1110/05/news025.html>, Japan.

Office Action in JP Application No. 2012-105518, mailed Jan. 5, 2016, for which an explanation of relevance is attached.

* cited by examiner

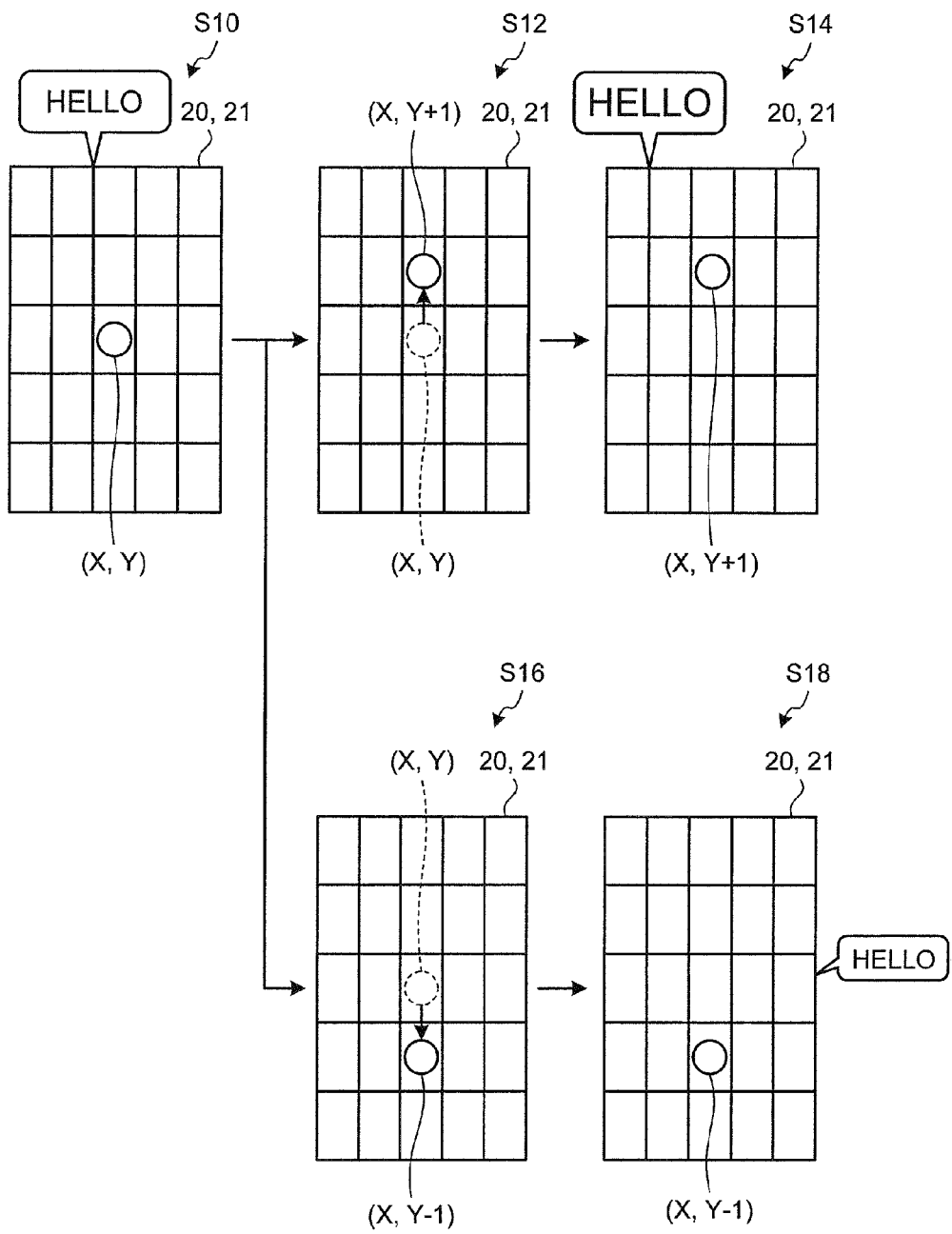

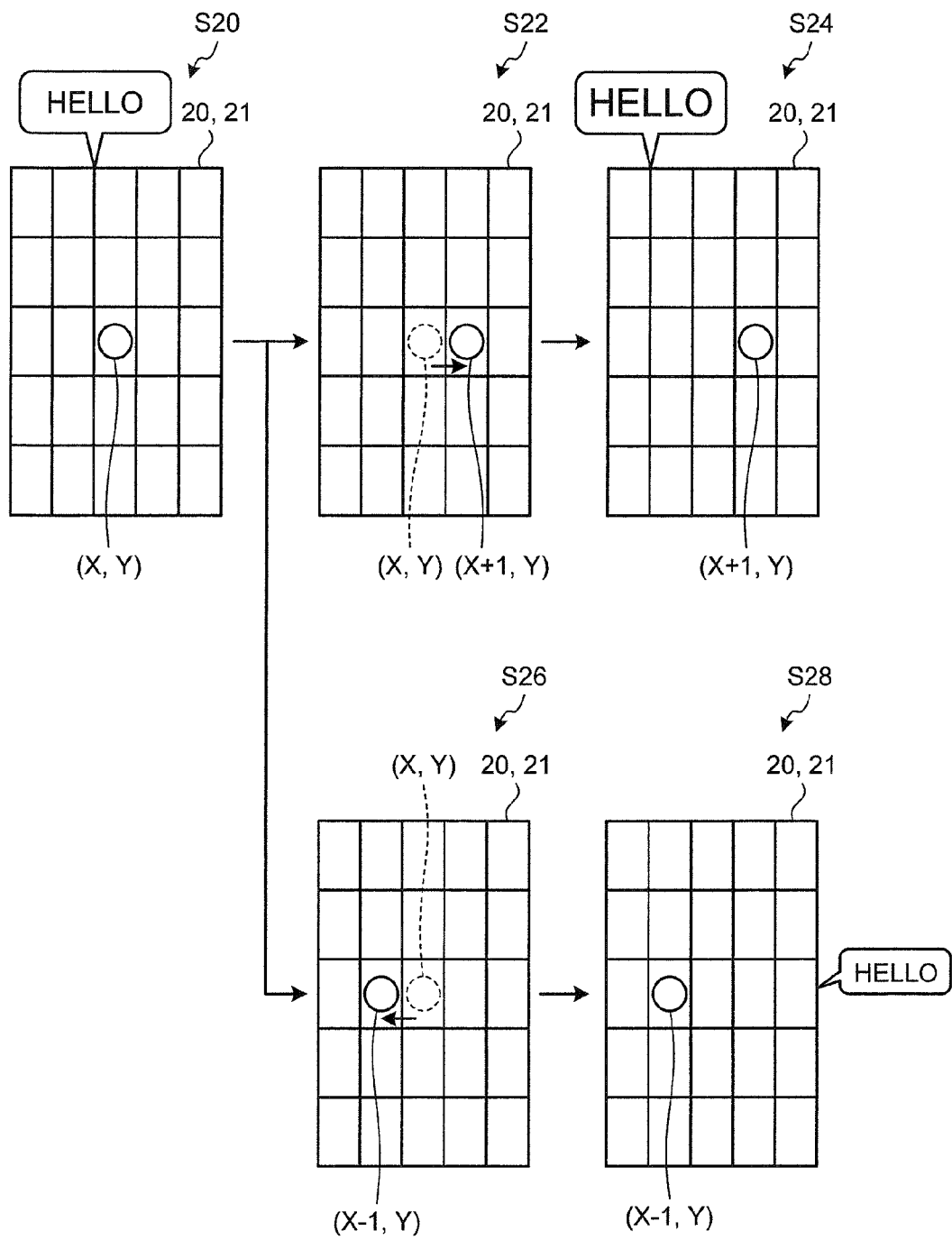

FIG.8A

| CONTACT POSITION | ... | (X, Y-2) | (X, Y-1) | (X, Y) | (X, Y+1) | (X, Y+2) | ... |
|---|---|---|---|---|---|---|---|
| SOUND VOLUME | ... | -10 | -5 | STANDARD | +5 | +10 | ... |

FIG.8B

| CONTACT POSITION | ... | (X-2, Y) | (X-1, Y) | (X, Y) | (X+1, Y) | (X+2, Y) | ... |
|---|---|---|---|---|---|---|---|
| SOUND VOLUME | ... | -20 | -10 | STANDARD | +10 | +20 | ... |

FIG.8C

| PRESSING FORCE | ... | N-2 | N-1 | N | N+1 | N+2 | ... |
|---|---|---|---|---|---|---|---|
| SOUND VOLUME | ... | -40 | -20 | STANDARD | +20 | +40 | ... |

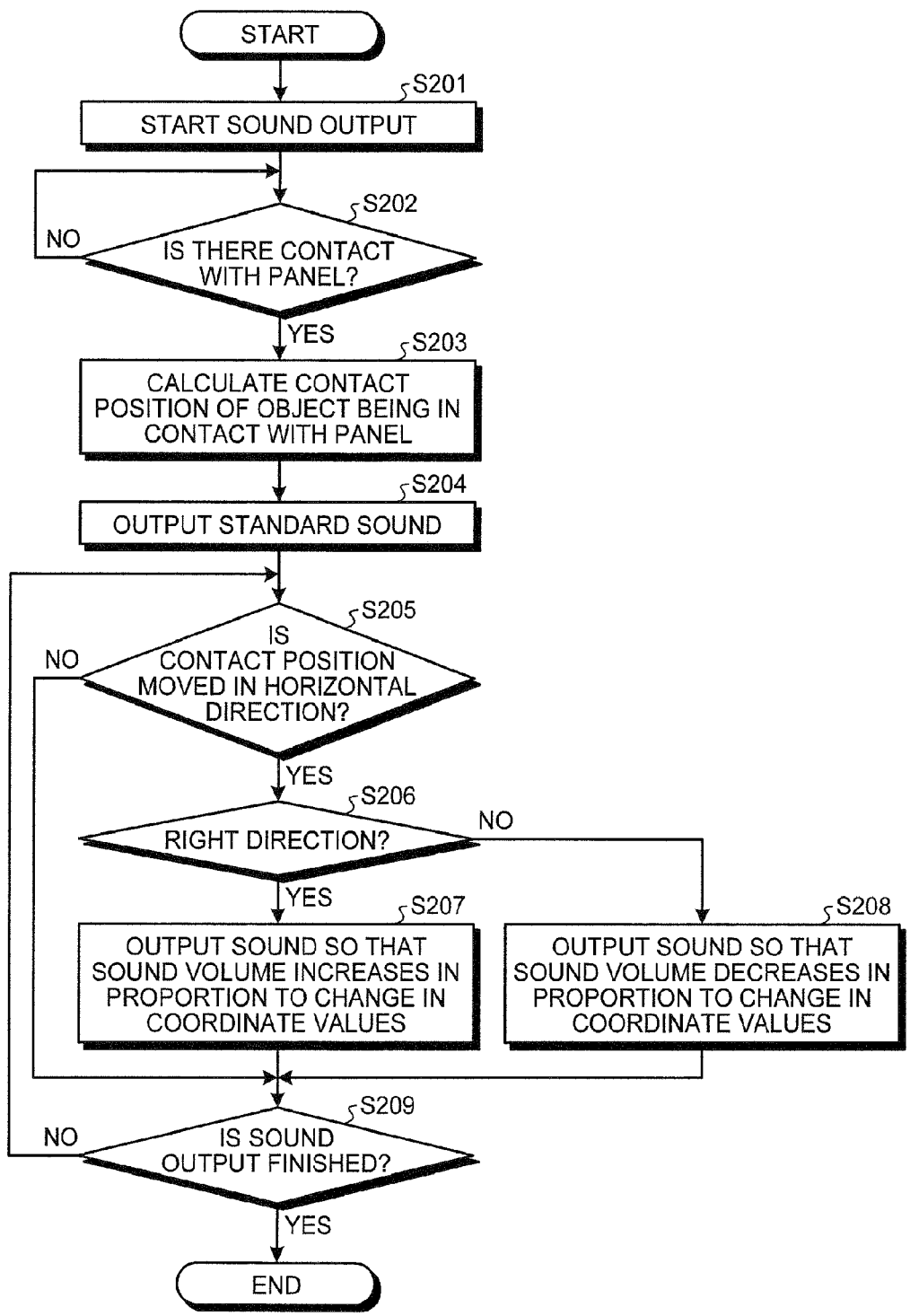

FIG.10A

| CONTACT POSITION | ... | (X, Y-2) | (X, Y-1) | (X, Y) | (X, Y+1) | (X, Y+2) | ... |
|---|---|---|---|---|---|---|---|
| SOUND VOLUME | ... | -20 | -10 | STANDARD | +10 | +20 | ... |

FIG.10B

| CONTACT POSITION | ... | (X-2, Y) | (X-1, Y) | (X, Y) | (X+1, Y) | (X+2, Y) | ... |
|---|---|---|---|---|---|---|---|
| TONE (HIGH-PITCHED) | ... | -20 | -10 | STANDARD | +10 | +20 | ... |
| TONE (LOW-PITCHED) | ... | +20 | +10 | STANDARD | -10 | -20 | ... |

FIG.10C

| PRESSING FORCE | ... | N-2 | N-1 | N | N+1 | N+2 | ... |
|---|---|---|---|---|---|---|---|
| SPEECH SPEED | ... | -20 | -10 | STANDARD | +10 | +20 | ... |

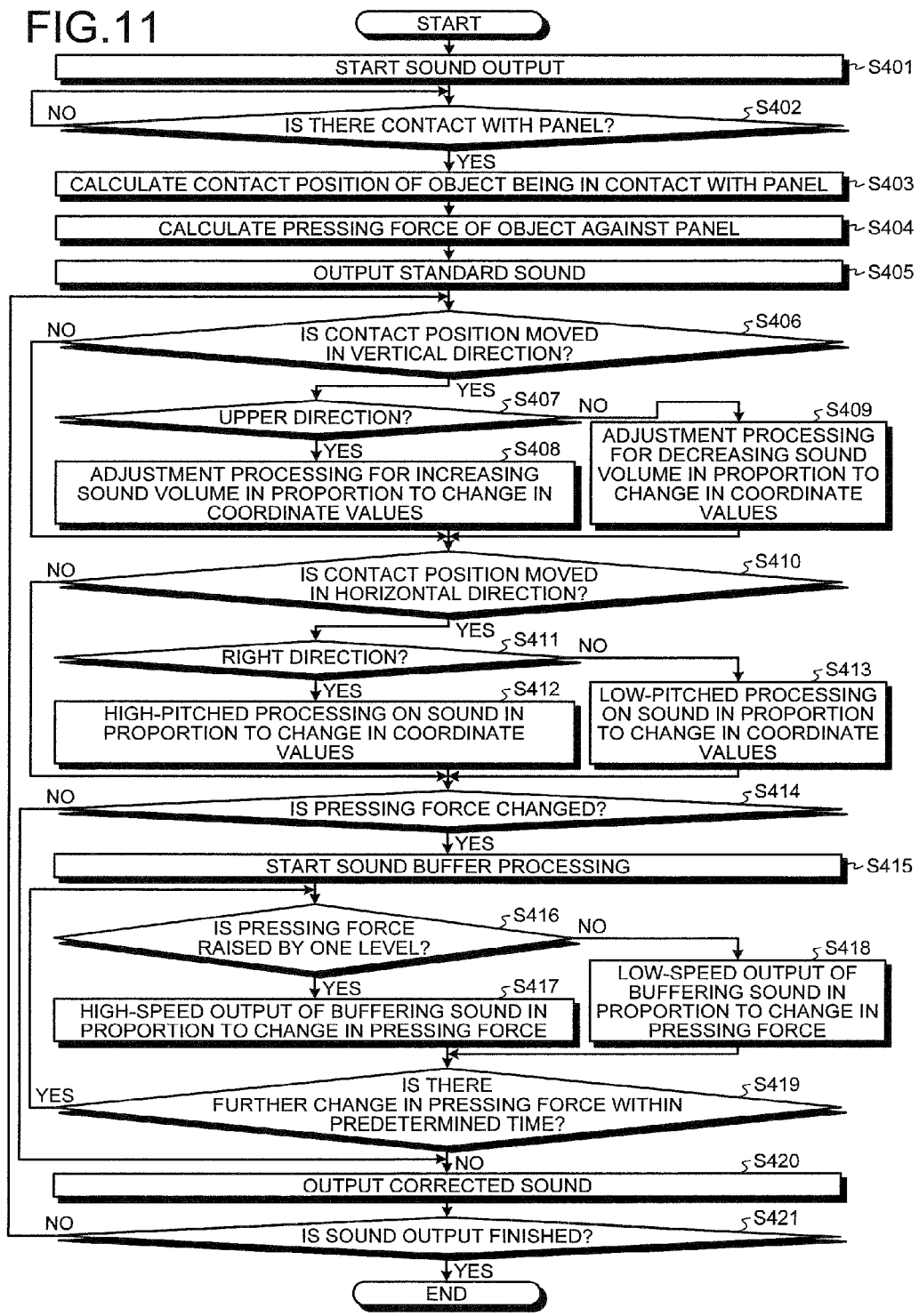

ELECTRONIC DEVICE HAVING SOUND GENERATING UNIT WITH PIEZOELECTRIC ELEMENT CONFIGURED FOR VIBRATION AND VOLUME ADJUSTMENT, AND CONTROL METHOD AND CONTROL PROGRAM FOR THE ELECTRONIC DEVICE

CROSS-REFERENCE TO RELATED APPLICATION

The present application is a National Phase of PCT International Application Number PCT/JP2013/062272 filed on Apr. 25, 2013, and claims the benefit of priority from Japanese Patent Application No. 2012-105518 filed on May 2, 2012.

FIELD

The present application relates to an electronic device, a control method, and a control program.

BACKGROUND

Patent Literature 1 discloses an electronic device for transmitting an air conduction sound and a vibration sound to a user. Patent Literature 1 discloses that, when a voltage is applied to a piezoelectric element of an oscillator arranged at an outer surface of a housing of the electronic device, the piezoelectric element is expanded and contracted, so that the oscillator is flexurally vibrated. Patent Literature 1 also discloses that the air conduction sound and the vibration sound are transmitted to the user when the user brings the oscillator being flexurally vibrated into contact with an auricle. According to Patent Literature 1, the air conduction sound is a sound transmitted to an auditory nerve of the user when vibration of air caused by vibration of an object is transmitted to an eardrum through an external auditory meatus and the eardrum is vibrated. According to Patent Literature 1, the vibration sound is a sound transmitted to the auditory nerve of the user via part of a body of the user (for example, a cartilage of an external ear) that makes contact with a vibrating object.

CITATION LIST

Patent Literature

Patent Literature 1: Japanese Patent Application Laid-open No. 2005-348193

Technical Problem

Generally, there is a need for electronic devices that allow a user to change volume of the sound transmitted to the user with a simple operation.

SUMMARY

According to an aspect, an electronic device includes: a piezoelectric element; a sound generating unit that is vibrated by the piezoelectric element and generates a vibration sound to be transmitted while vibrating part of a human body; and a detection unit that detects contact of the part of the human body with the sound generating unit. A volume of the vibration sound is changed corresponding to a detection result of the detection unit.

According to another aspect, a control method is performed by an electronic device comprising a sound generating unit and a piezoelectric element. The control method includes: vibrating the sound generating unit with the piezoelectric element to cause the sound generating unit to generate a vibration sound to be transmitted while vibrating part of a human body; and detecting contact of the part of the human body with the sound generating unit. A volume of the vibration sound is changed corresponding to a detection result at the detecting.

According to another aspect, a control program that causes an electronic device comprising a sound generating unit and a piezoelectric element to execute: vibrating the sound generating unit with the piezoelectric element to cause the sound generating unit to generate a vibration sound to be transmitted while vibrating part of a human body; and detecting contact of the part of the human body with the sound generating unit. A volume of the vibration sound is changed corresponding to a detection result at the detecting.

BRIEF DESCRIPTION OF DRAWINGS

FIG. 7A is a diagram for explaining control for changing sound volume.

FIG. 7B is a diagram for explaining the control for changing the sound volume.

FIG. 8A is a diagram illustrating an example of a change in the sound volume.

FIG. 8B is a diagram illustrating an example of a change in the sound volume.

FIG. 8C is a diagram illustrating an example of a change in the sound volume.

FIG. 9B is a flowchart illustrating the processing procedure of the control for changing the sound volume.

FIG. 10A is a diagram illustrating an example of a change in the sound volume.

FIG. 10B is a diagram illustrating an example of a change in tone.

FIG. 10C is a diagram illustrating an example of a change in speech speed.

FIG. 11 is a flowchart illustrating a processing procedure of control for changing the sound volume, the tone, and the speech speed.

DESCRIPTION OF EMBODIMENTS

The following describes embodiments of the present invention in detail with reference to the drawings. Hereinafter, the mobile phone will be described as an example of an electronic device for transmitting an air conduction sound and a vibration sound to a user.

First Embodiment

Figure 1:
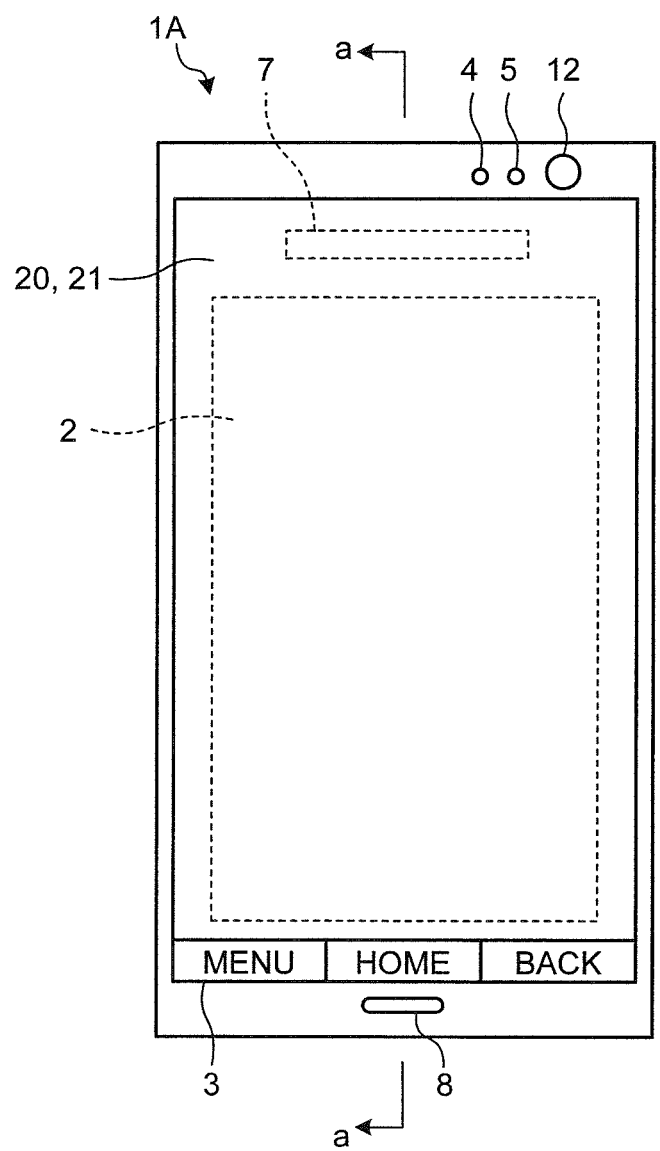
FIG. 1 is a front view of a mobile phone according to an embodiment.
Figure 2:
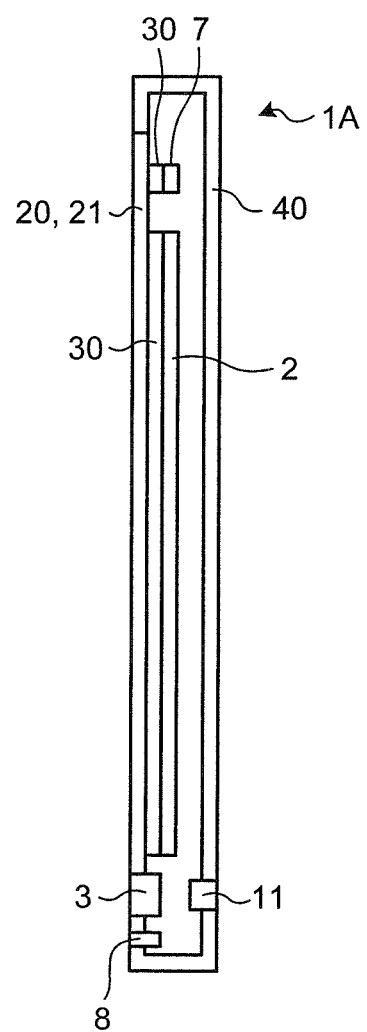
FIG. 2 is a cross-sectional view of the mobile phone according to the embodiment.

With reference to FIG. 1 and FIG. 2, the following describes the overall configuration of a mobile phone 1A according to the embodiment. FIG. 1 is a front view of the mobile phone 1A. FIG. 2 is a cross-sectional view schematically illustrating a cross-section along a-a line of the mobile phone 1A. As illustrated in FIG. 1 and FIG. 2, the mobile phone 1A includes a display 2, buttons 3, an illuminance sensor 4, a proximity sensor 5, a piezoelectric element 7, a microphone 8, a speaker 11, a camera 12, a panel 20, and a housing 40.

The display 2 includes a display device such as a liquid crystal display (LCD), an organic electro-luminescence display (OELD), or an inorganic electro-luminescence display (IELD). The display 2 displays a character, an image, a symbol, a figure, and the like.

Each of the buttons 3 receives an operation input from a user. The number of buttons 3 is not limited to the example illustrated in FIG. 1 and FIG. 2.

The illuminance sensor 4 detects an illuminance of ambient light around the mobile phone 1A. The illuminance represents intensity, brightness, or luminance of the light. The illuminance sensor 4 is used, for example, to adjust luminance of the display 2. The proximity sensor 5 detects presence of a neighboring object in a non-contact state. The proximity sensor 5 detects presence of an object based on a change in a magnetic field, a change in returning time of a reflected wave of an ultrasonic wave, or the like. The proximity sensor 5 detects that, for example, the display 2 is brought close to a face. The illuminance sensor 4 and the proximity sensor 5 may be configured as one sensor. The illuminance sensor 4 may be used as a proximity sensor.

When an electric signal (voltage corresponding to a sound signal) is applied, the piezoelectric element 7 expands/contracts or bends according to an electromechanical coupling coefficient of a component material. That is, the piezoelectric element 7 is deformed when the electric signal is applied thereto. The piezoelectric element 7 is attached to the panel 20, and used as a vibration source for vibrating the panel 20. The piezoelectric element 7 is formed of, for example, ceramic or crystal. The piezoelectric element 7 may be a unimorph, a bimorph, or a laminated piezoelectric element. The laminated piezoelectric element includes a laminated bimorph element formed by laminating bimorphs (for example, laminated by sixteen layers or twenty-four layers). The laminated piezoelectric element includes, for example, a laminated structure of a plurality of dielectric layers formed of lead zirconate titanate (PZT) and electrode layers each arranged between the dielectric layers. The unimorph expands and contracts when the electric signal (voltage) is applied thereto. The bimorph bends when the electric signal (voltage) is applied thereto.

The microphone 8 is a sound input unit. The microphone 8 converts an input sound into the electric signal. The speaker 11 is a sound output unit that outputs a sound using an air conduction system. The speaker 11 is, for example, a dynamic speaker, and can transmit the sound converted from the electric signal to a person whose ear is not in contact with the mobile phone 1A. The speaker 11 is used, for example, to output music.

The camera 12 is an in-camera that photographs an object facing the display 2. The camera 12 converts a photographed image into the electric signal. The mobile phone 1A may include, in addition to the camera 12, an out-camera that photographs an object facing a surface opposed to the display 2.

The panel 20 is vibrated corresponding to the deformation (expansion/contraction or bend) of the piezoelectric element 7, and transmits the vibration to a cartilage of the ear (auricular cartilage) and the like that is brought into contact with the panel 20 by the user. The panel 20 also has a function for protecting the display 2, the piezoelectric element 7, and the like from an external force. The panel 20 is formed of, for example, glass or synthetic resins such as acrylic. The panel 20 has, for example, a plate-shape. The panel 20 may be a flat plate. The panel 20 may be a curved surface panel of which surface is smoothly curved.

The display 2 and the piezoelectric element 7 are attached to the back surface of the panel 20 with a joining member 30. The piezoelectric element 7 is spaced at a predetermined distance from an inner surface of the housing 40 in a state of being arranged on the back surface of the panel 20. The piezoelectric element 7 is preferably spaced from the inner surface of the housing 40 also in a state of being expanded/contracted or bent. That is, the distance between the piezoelectric element 7 and the inner surface of the housing 40 may be larger than a maximum deformation amount of the piezoelectric element 7. The piezoelectric element 7 may be attached to the panel 20 via a reinforcing member (for example, sheet metal or glass fiber reinforced resin). The joining member 30 is, for example, a double-sided tape or an adhesive agent having a thermosetting property, ultraviolet curability, or the like. The joining member 30 may be photo-elastic resin that is a colorless and transparent acrylic ultraviolet-curable adhesive agent.

The display 2 is arranged at substantially the center in the lateral direction of the panel 20. The piezoelectric element 7 is arranged at a nearby position spaced at a predetermined distance from an end in the longitudinal direction of the panel 20 so that the longitudinal direction of the piezoelectric element 7 is parallel to the lateral direction of the panel 20. The display 2 and the piezoelectric element 7 are arranged in parallel with each other on an inner surface of the panel 20.

A touch screen (touch sensor) 21 is arranged on substantially the entire outer surface of the panel 20. The touch screen 21 detects contact with the panel 20. The touch screen 21 is used for detecting a contact operation by the user with a finger, a pen, a stylus pen, or the like. Examples of a gesture detected by using the touch screen 21 include, but are not limited to, touch, long touch, release, swipe, tap, double tap, long tap, drag, flick, pinch-in, and pinch-out. A detection system of the touch screen 21 may be any of an electrostatic capacitance system, a resistance film system, a surface acoustic wave system (or an ultrasonic system), an infrared system, an electromagnetic induction system, a load detection system, and the like.

The touch screen 21 is also used for detecting an object such as an auricular cartilage that is brought into contact with the panel 20 to listen to the sound. The touch screen 21 is also used for detecting a pressing force to the panel 20 from the object such as the auricular cartilage being in contact with the panel 20.

The housing 40 is made of resin or metal. The housing 40 supports the buttons 3, the illuminance sensor 4, the proximity sensor 5, the microphone 8, the speaker 11, the camera 12, the panel 20, and the like.

Figure 3:
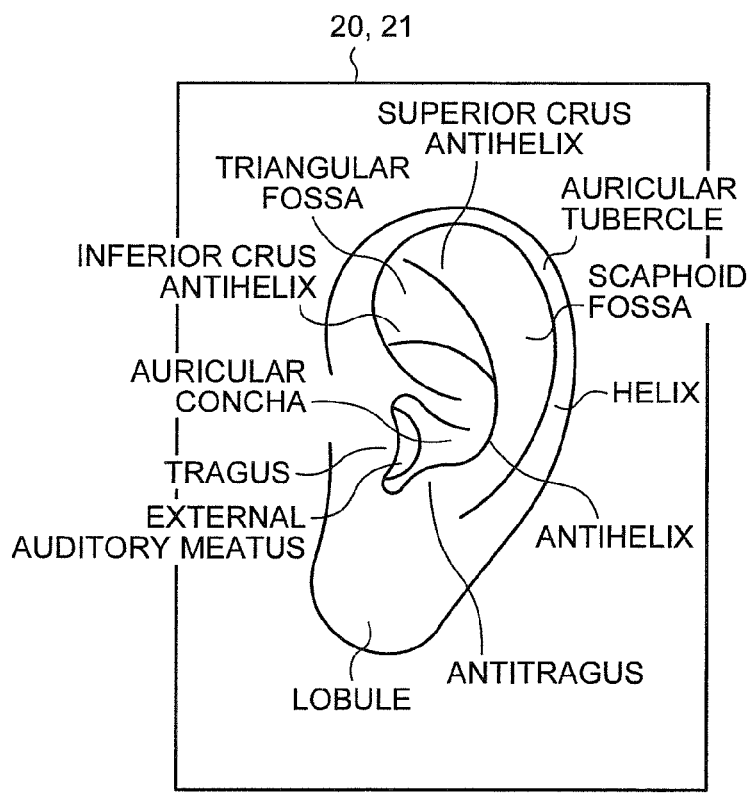
FIG. 3 is a diagram illustrating an example of a shape of a panel.
Figure 4:
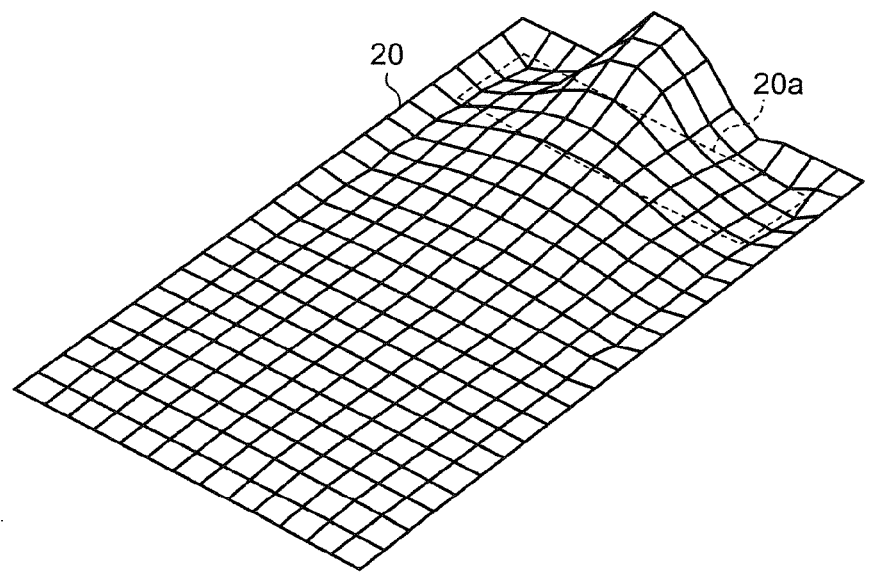
FIG. 4 is a diagram illustrating an example of vibration of the panel.

The following describes a sound output by the mobile phone 1A according to the embodiment in more detail with reference to FIG. 1 to FIG. 4. FIG. 3 is a diagram illustrating an example of the shape of the panel 20. FIG. 4 is a diagram illustrating an example of the vibration of the panel 20.

An electric signal corresponding to the output sound is applied to the piezoelectric element 7. For example, a voltage of ±15 V, which is higher than ±5 V as an applied voltage of what is called a panel speaker that transmits a sound using an air conduction sound via the external auditory meatus, may be applied to the piezoelectric element 7. Accordingly, for example, even when the user presses part of his/her body against the panel 20 with a force of 3 N or more (force of 5 N to 10 N), the panel 20 is sufficiently vibrated to generate a vibration sound to be transmitted via the part of the user's body. The voltage applied to the piezoelectric element 7 can be appropriately adjusted according to fixing strength of the panel 20 to the housing 40, performance of the piezoelectric element 7, or the like.

When the electric signal is applied, the piezoelectric element 7 is expanded/contracted or bent in the longitudinal direction. The panel 20 to which the piezoelectric element 7 is attached is deformed corresponding to the expansion/contraction or bend of the piezoelectric element 7. Due to this, the panel 20 is vibrated and generates the air conduction sound. When the user brings part of his/her body (for example, the auricular cartilage) into contact with the panel 20, the panel 20 generates a vibration sound to be transmitted to the user via the part of the body. That is, the panel 20 is vibrated with a frequency perceived as a vibration sound with respect to the object being in contact with the panel 20 corresponding to the deformation of the piezoelectric element 7. The panel 20 is curved corresponding to the expansion/contraction or bend of the piezoelectric element 7. The panel 20 is bent directly by the piezoelectric element 7. "The panel 20 is bent directly by the piezoelectric element" means a phenomenon different from a phenomenon, which is applied to conventional panel speakers, in which a specific region of the panel is excited by an inertial force of a piezoelectric actuator configured by arranging the piezoelectric element in a casing, and the panel is deformed. "The panel 20 is bent directly by the piezoelectric element" means that the panel is bent directly due to the expansion/contraction or bend (curve) of the piezoelectric element via the joining member, or via the joining member and a reinforcing member 31 described later.

For example, when the electric signal corresponding to a voice of a call partner or sound data such as a ring tone and music is applied to the piezoelectric element 7, the panel 20 generates the air conduction sound and the vibration sound corresponding to the electric signal. A sound signal output via the piezoelectric element 7 and the panel 20 may be based on sound data stored in a storage 9 described later. The sound signal output via the piezoelectric element 7 and the panel 20 may be based on sound data stored in an external server and the like and acquired by a communication unit 6 described later via a network.

In the present embodiment, a size of the panel 20 may be substantially the same as that of the ear of the user. The size of the panel 20 may be, as illustrated in FIG. 3, larger than that of the ear of the user. In this case, the user can bring substantially the entire outer periphery of the ear into contact with the panel 20 to listen to the sound. When the user listens to the sound in this way, an ambient sound (noise) is hardly transmitted to the external auditory meatus. In the present embodiment, at least a region of the panel 20 is vibrated, the region being larger than a region having a length in the longitudinal direction (or the lateral direction) corresponding to a distance between an inferior crus of antihelix (inferior crus antihelix) and an antitragus and a length in the lateral direction (or the longitudinal direction) corresponding to a distance between a tragus and an antihelix of a man. A region of the panel 20 may be vibrated, the region having the length in the longitudinal direction (or the lateral direction) corresponding to a distance between a portion of a helix near a superior crus of antihelix (superior crus antihelix) and a lobule and the length in the lateral direction (or the longitudinal direction) corresponding to a distance between the tragus and a portion of the helix near the antihelix. The region having the length and the width as described above may be a rectangular region, or may be an elliptical region of which major axis is the length in the longitudinal direction and a minor axis thereof is the length in the lateral direction. An ordinary size of a human ear can be found, for example, in the database of human body dimensions of Japanese (1992-1994) created by Research Institute of Human Engineering for Quality Life (HQL).

As illustrated in FIG. 4, not only the attachment region 20a to which the piezoelectric element 7 is attached, but also a region of the panel 20 spaced apart from the attachment region 20a is vibrated. The panel 20 includes a plurality of portions vibrated in a direction intersecting with a principal plane of the panel 20 in the vibrating region. At each of the portions, a value of the amplitude of the vibration is changed from positive to negative or vice versa with time. At each moment, the panel 20 is vibrated such that portions where the amplitude of the vibration is relatively large and portions where the amplitude of the vibration is relatively small are randomly or regularly distributed on substantially the entire panel 20. That is, vibration of a plurality of waves is detected over the entire area of the panel 20. When the voltage applied to the piezoelectric element 7 is ±15 V as described above, the vibration of the panel 20 described above is hardly attenuated even if the user presses the panel 20 against his/her body with a force of 5 N to 10 N, for example. Due to this, the user can listen to the vibration sound even when the user brings his/her ear into contact with a region on the panel 20 spaced apart from the attachment region 20a.

In the present embodiment, the display 2 is attached to the panel 20. Accordingly, rigidity of a lower part of the panel 20 (a side to which the display 2 is attached) is increased, and the vibration of the lower part of the panel 20 is smaller than that of an upper part of the panel 20 (a side to which the piezoelectric element 7 is attached). Due to this, leakage of the air conduction sound caused by the vibration of the panel 20 is reduced at the lower part of the panel 20. The upper part of the panel 20 is bent directly by the piezoelectric element 7, and the vibration of the lower part is attenuated as compared with that of the upper part. The panel 20 is bent by the piezoelectric element 7 so that a portion immediately above the piezoelectric element 7 protrudes the highest as compared with surroundings thereof in the long side direction of the piezoelectric element 7.

The mobile phone 1A can transmit the air conduction sound and the vibration sound via part of the user's body (for example, the auricular cartilage) through the vibration of the panel 20. Accordingly, when outputting a sound of which volume is comparable to that of a dynamic receiver, the mobile phone 1A can reduce the sound transmitted to the surroundings of the mobile phone 1A through the vibration of air as compared with that of an electronic device including only a dynamic speaker. Such a characteristic is preferable, for example, in a case of listening to a recorded message at a place where there are other people such as in a train.

The mobile phone 1A also transmits the vibration sound to the user through the vibration of the panel 20. Accordingly, even when wearing an earphone or a headphone, the user can bring the mobile phone 1A into contact therewith to listen to the vibration sound through the vibration of the panel 20 via the earphone or the headphone and part of the body.

The mobile phone 1A transmits the sound through the vibration of the panel 20. Accordingly, when the mobile phone 1A does not separately include the dynamic receiver, it is not necessary to form, in the housing 40, an opening (sound emitting port) for transmitting the sound emitted from the panel 20 to the outside. Due to this, in a case of making a waterproof structure, the structure can be simplified. When it is necessary to form the opening such as a sound emitting port of the dynamic speaker in the housing 40, the mobile phone 1A may employ a structure of blocking the opening with a member that passes gas but not liquid to make the waterproof structure. The member that passes gas but not liquid is, for example, GORE-TEX (registered trademark).

Figure 5:
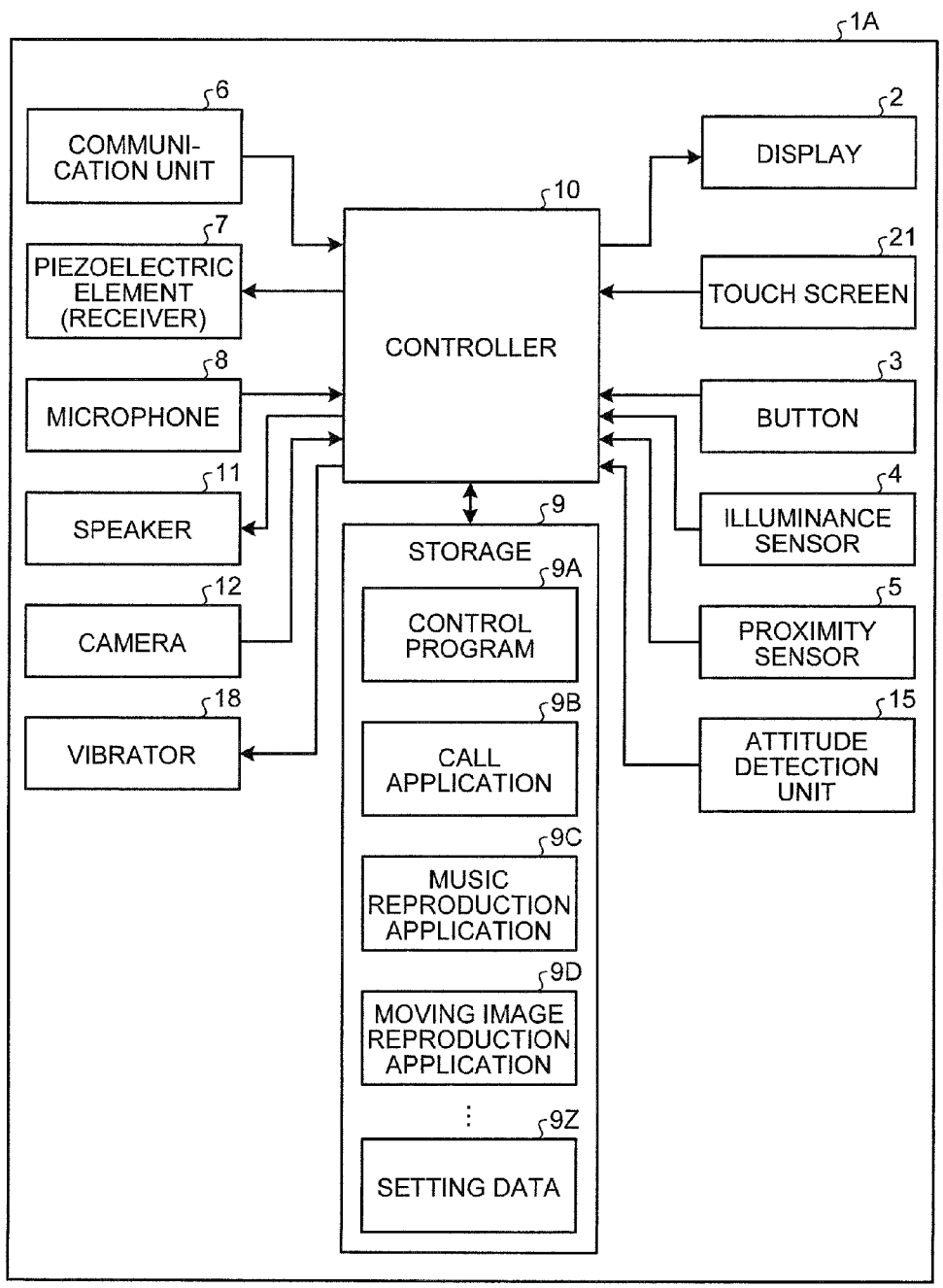
FIG. 5 is a block diagram of the mobile phone according to the embodiment.

The following describes a functional structure of the mobile phone 1A with reference to FIG. 5. FIG. 5 is a block diagram of the mobile phone 1A. As illustrated in FIG. 5, the mobile phone 1A includes the display 2, the button 3, the illuminance sensor 4, the proximity sensor 5, the communication unit 6, the piezoelectric element 7, the microphone 8, the storage 9, a controller 10, the speaker 11, the camera 12, an attitude detection unit 15, a vibrator 18, and the touch screen 21.

The communication unit 6 performs communication in a wireless manner. A communication system supported by the communication unit 6 is a wireless communication standard. Examples of the wireless communication standard include, but are not limited to, communication standards for cellular phone such as 2G, 3G, and 4G. Examples of the communication standard for cellular phone include, but are not limited to, long term evolution (LTE), wideband code division multiple access (W-CDMA), CDMA 2000, personal digital cellular (PDC), global system for mobile communications (GSM) (registered trademark), and personal handyphone system (PHS). The examples of the wireless communication standard further include, but are not limited to, worldwide interoperability for microwave access (WiMAX), IEEE 802.11, Bluetooth (registered trademark), Infrared Data Association (IrDA), and near field communication (NFC). The communication unit 6 may support one or more of the communication standards described above.

The storage 9 stores therein a computer program and data. The storage 9 is also used as a working area for temporarily storing therein a processing result of the controller 10. The storage 9 may include any non-transitory storage medium such as a semiconductor storage medium and a magnetic storage medium. The storage 9 may include a plurality of types of storage media. The storage 9 may include a combination of a portable storage medium such as a memory card, an optical disc, or a magneto-optical disc and a reading device of the storage medium. The storage 9 may include a storage device that is used as a temporary storage region such as a random access memory (RAM).

The computer program stored in the storage 9 includes an application executed in the foreground or the background and a control program for assisting an operation of the application. The application causes, for example, the display 2 to display a screen, and causes the controller 10 to perform processing corresponding to a gesture detected by the touch screen 21. The control program is, for example, an operating system (OS). The application and the control program may be installed in the storage 9 via wireless communication with the communication unit 6 or a non-transitory storage medium.

The storage 9 stores therein, for example, a control program 9A, a call application 9B, a music reproduction application 9C, a moving image reproduction application 9D, and setting data 9Z. The call application 9B provides a call function for a call via wireless communication. The music reproduction application 9C provides a music reproduction function for reproducing sounds from music data. The moving image reproduction application 9D provides a moving image reproduction function for reproducing a moving image and sounds from moving image data. The setting data 9Z includes information about various settings related to an operation of the mobile phone 1A.

The control program 9A provides functions related to various control processes for operating the mobile phone 1A. The control program 9A determines, for example, an operation by the user based on contact detected by the touch screen 21, and activates a computer program corresponding to the determined operation. The functions provided by the control program 9A includes a function for performing control to change the sound volume depending on the position of the ear being in contact with the panel 20, a function for performing control to change the sound volume depending on the pressing force to the panel 20 from the ear being in contact therewith, and a function for performing control to change the sound volume, tone, and a speech speed depending on the position and the pressing force of the ear. The functions provided by the control program 9A may be used in combination with a function provided by another computer program such as the call application 9B in some cases.

The controller 10 is a processing unit. Examples of the processing unit include, but are not limited to, a central processing unit (CPU), a system-on-a-chip (SoC), a micro control unit (MCU), and a field-programmable gate array (FPGA). The controller 10 integrally controls the operation of the mobile phone 1A to implement various functions.

Specifically, the controller 10 executes a command included in the computer program stored in the storage 9 while referring to the data stored in the storage 9 as needed. The controller 10 then controls a functional unit corresponding to the data and the command to implement various functions. Examples of the functional unit include, but are not limited to, the display 2, the communication unit 6, the piezoelectric element 7, the microphone 8, the speaker 11, and the vibrator 18. The controller 10 may change the control depending on a detection result of the detection unit.

Examples of the detection unit include, but are not limited to, the button 3, the illuminance sensor 4, the proximity sensor 5, the camera 12, the attitude detection unit 15, and the touch screen 21.

The controller 10 executes, for example, the control program 9A to perform control for changing the sound volume depending on the position of the ear being in contact with the panel 20, control for changing the sound volume depending on the pressing force to the panel 20 from the ear being in contact therewith, and control for changing the sound volume, the tone, and the speech speed depending on the position and the pressing force of the ear.

The attitude detection unit 15 detects an attitude of the mobile phone 1A. The attitude detection unit 15 includes at least one of an acceleration sensor, an azimuth sensor, and a gyroscope to detect the attitude. The vibrator 18 vibrates part of or the entire mobile phone 1A. The vibrator 18 includes, for example, a piezoelectric element or an eccentric motor to generate the vibration. The vibration generated by the vibrator 18 is used for notifying the user of various events such as an incoming call, not for transmitting the sound.

Part of or the entire computer program and data stored in the storage 9 in FIG. 5 may be downloaded from another device via wireless communication with the communication unit 6. Part of or the entire computer program and data stored in the storage 9 in FIG. 5 may be stored in a non-transitory storage medium that can be read by the reading device included in the storage 9. Examples of the non-transitory storage medium include, but are not limited to, an optical disc such as a CD (registered trademark), a DVD (registered trademark), and a Blu-ray (registered trademark), a magneto-optical disc, a magnetic storage medium, a memory card, and a solid-state storage medium.

The configuration of the mobile phone 1A illustrated in FIG. 5 is exemplary only, and may be appropriately modified within a range that does not change the gist of the present invention. For example, the mobile phone 1A may include buttons of ten-key layout, QWERTY layout, or the like as buttons for operation.

Figure 6A:
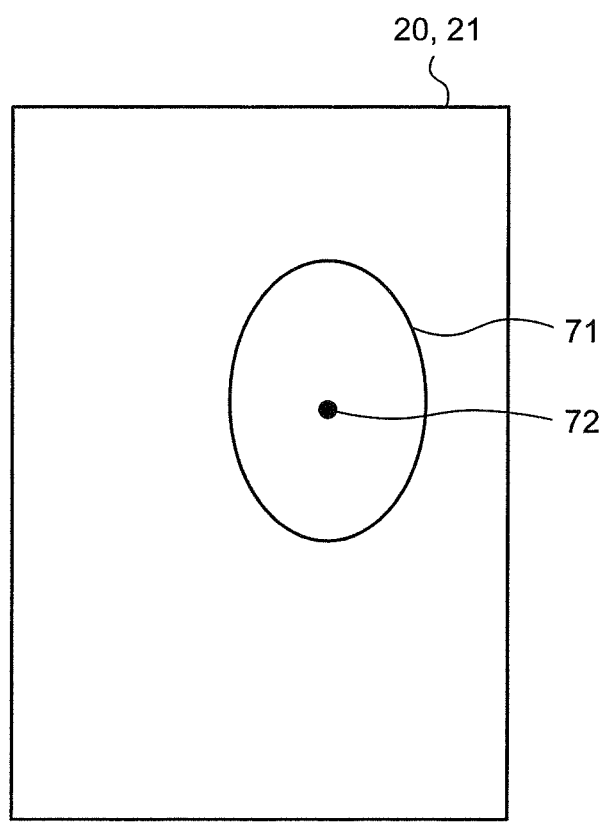
FIG. 6A is a diagram for explaining detection of a position of an ear.
Figure 9A:
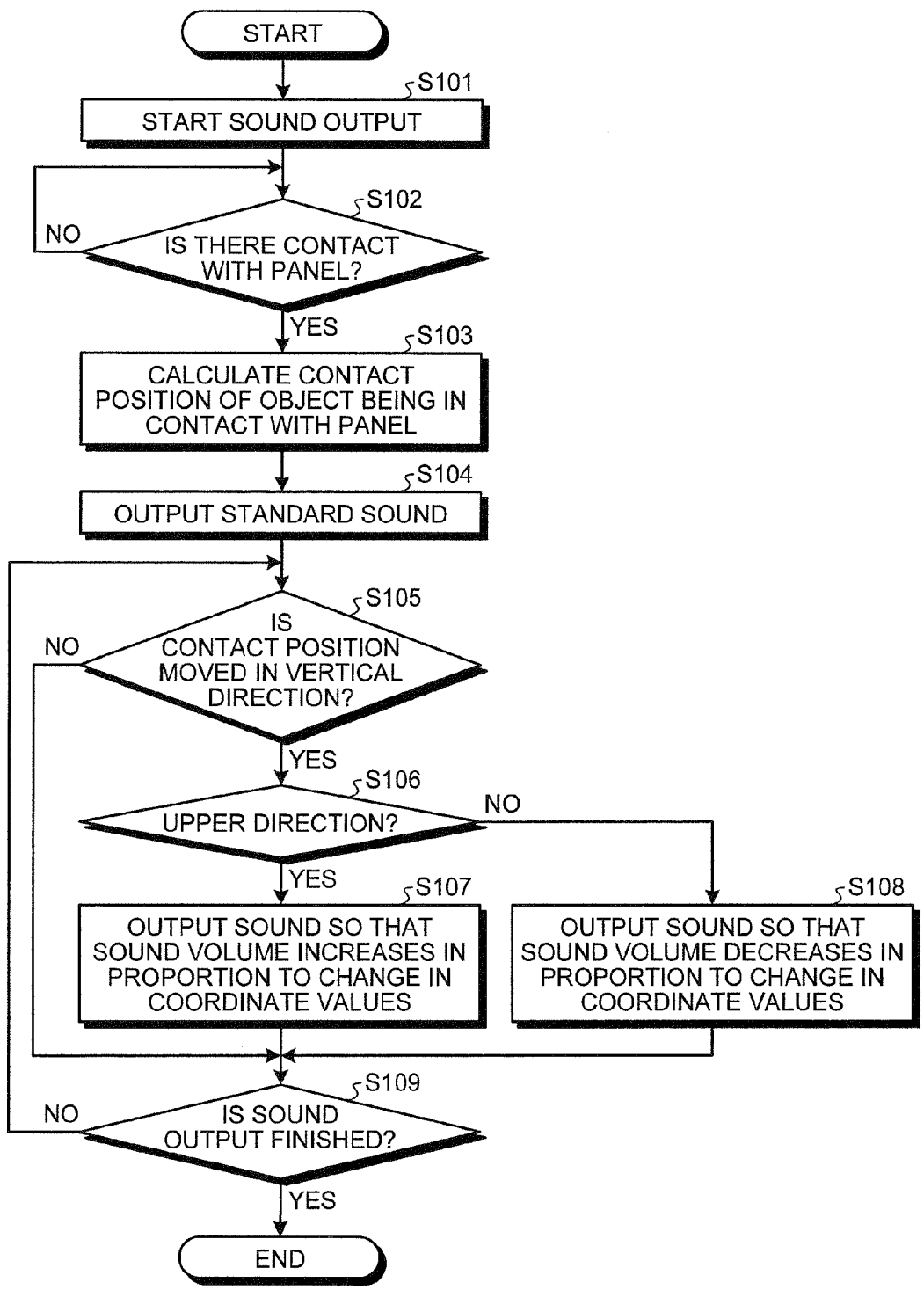
FIG. 9A is a flowchart illustrating a processing procedure of the control for changing the sound volume.
Figure 9C:
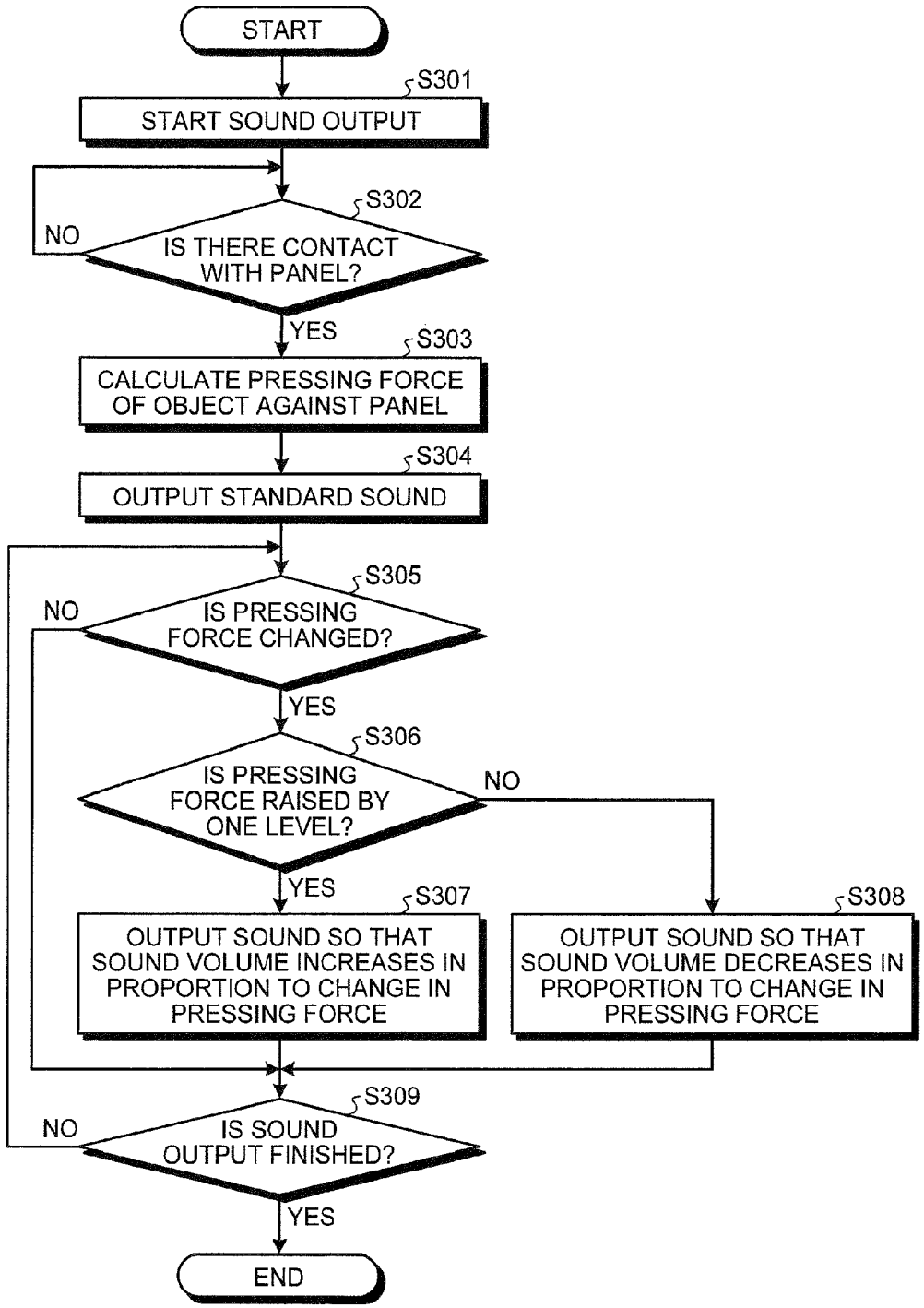
FIG. 9C is a flowchart illustrating the processing procedure of the control for changing the sound volume.

With reference to FIG. 6A to FIG. 9C, the following describes control for changing the sound volume depending on the position of the ear being in contact with the panel 20, and control for changing the sound volume depending on the pressing force to the panel 20 from the ear being in contact therewith. FIG. 6A to FIG. 6C are diagrams for explaining detection of the position of the ear being in contact with the panel 20. FIG. 7A to FIG. 7C are diagrams for explaining control for changing the sound volume depending on the position of the ear being in contact with the panel 20 or the pressing force to the panel 20 from the ear being in contact therewith. FIG. 8A to FIG. 8C are diagrams illustrating an example of change in the sound volume. FIG. 9A to FIG. 9C are flowcharts illustrating a processing procedure of the control for changing the sound volume.

Figure 6B:
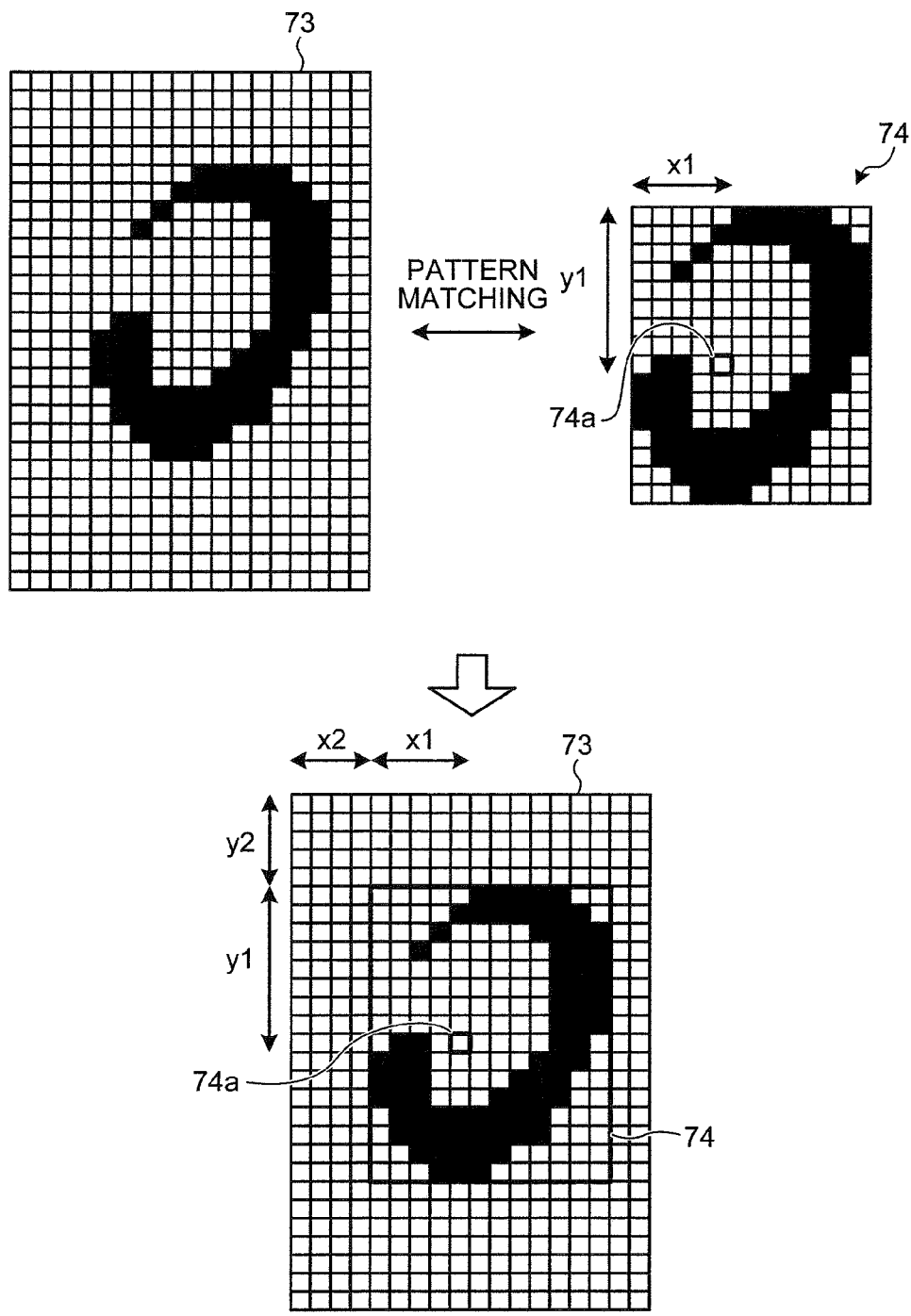
FIG. 6B is a diagram for explaining the detection of the position of the ear.
Figure 6C:
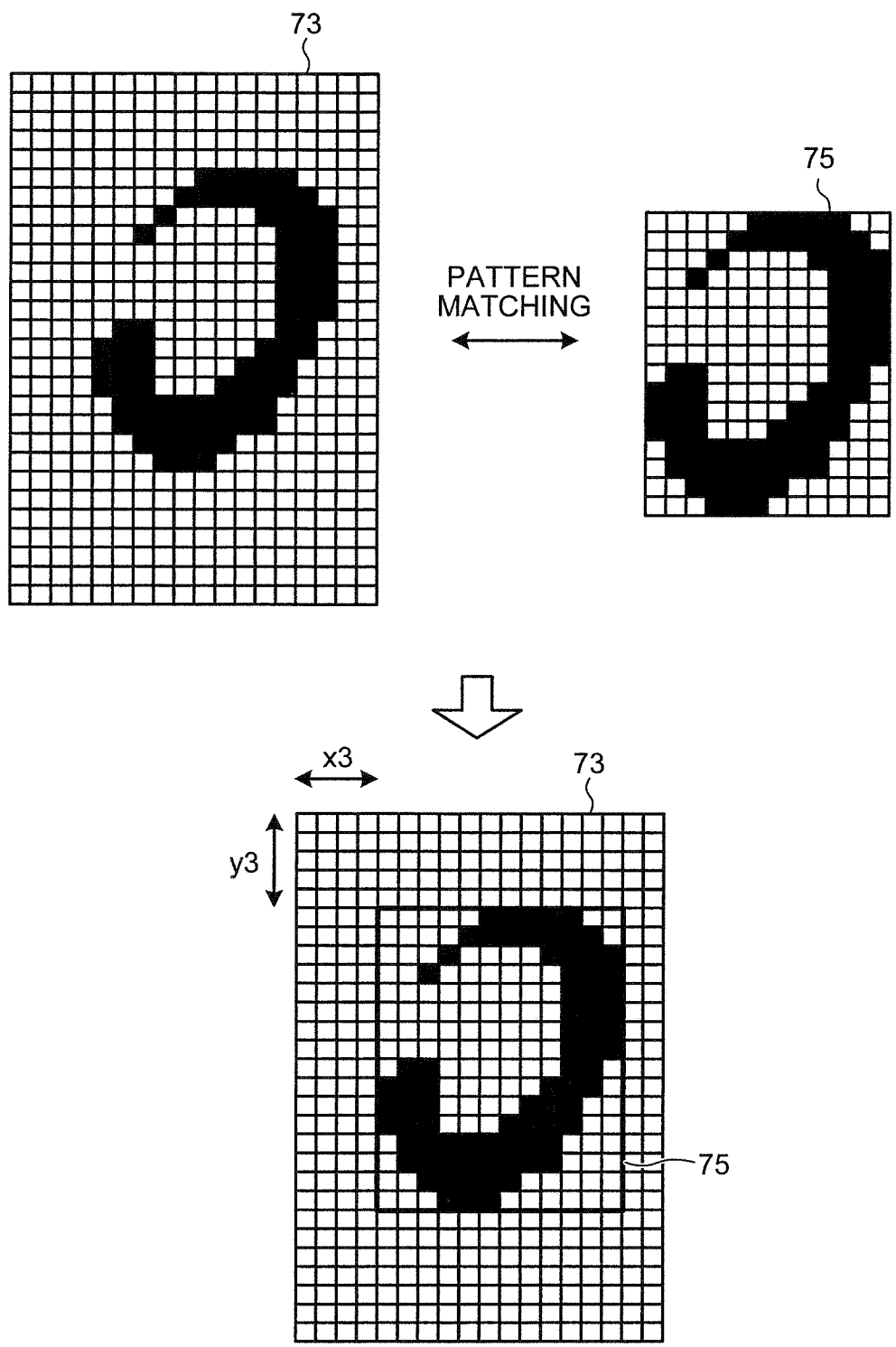
FIG. 6C is a diagram for explaining the detection of the position of the ear.

With reference to FIG. 6A to FIG. 6C, the following describes the detection of the position of the ear being in contact with the panel 20 performed by the mobile phone 1A.

The mobile phone 1A detects the position of the ear being in contact with the panel 20 using the touch screen 21. For example, as illustrated in FIG. 6A, the mobile phone 1A detects a position 72 determined based on a region 71 in which the touch screen 21 detects the contact of the ear as the position of the ear (hereinafter, referred to as a "contact position" in some cases). The position 72 is, for example, the center (the center of gravity) of the region 71. The position 72 may be any of the apexes of a minimum rectangle including the region 71. The position 72 may be a position corresponding to a predetermined part of the ear. In this case, the position 72 is calculated using a relative positional relation with respect to the region 71 based on information about a general position of the part in the ear.

According to this system, the position of the ear being in contact with the panel 20 can be detected without performing complicated arithmetic operation. This system can also be applied to a case in which the number of points is small at which the touch screen 21 can detect the contact with the panel 20 at the same time.

Alternatively, as illustrated in FIG. 6B, the mobile phone 1A detects the position of the ear by pattern matching between a sample 74 prepared in advance and an image 73 obtained based on a detection result of the touch screen 21 being in contact with the object. The image 73 is obtained by dividing a detection region of the touch screen 21 in a grid pattern and converting a detection state of the contact of the object in each of the divided regions into a state of a corresponding pixel. In a case in which a value detected by the touch screen 21 in each region varies, for example, depending on a distance between the touch screen 21 and the object or the pressing force of the object against the touch screen 21, the image 73 may be a multi-gradation image.

The sample 74 is an image supposed to be obtained, when the ear is in contact with the touch screen 21, in the same manner as the image 73 in a region being in contact with the ear. The sample 74 may be an image supposed to be obtained when the ear of the user of the mobile phone 1A is in contact with the touch screen 21, or may be an image supposed to be obtained when the ear of an ordinary person is in contact therewith. A plurality of samples 74 may be prepared such as an image of a right ear and an image of a left ear.

The sample 74 includes a standard position 74a corresponding to a predetermined part of the ear (for example, a tragus). The standard position 74a is positioned at (x1, y1) using the upper left of the sample 74 as a reference. The standard position 74a may be set based on information about the position of the same part in an ordinary person. In a case in which the sample 74 is an image actually obtained when the ear of the user of the mobile phone 1A is in contact with the touch screen 21, the standard position 74a may be set by analyzing the image.

When the image 73 is obtained, the mobile phone 1A obtains, by pattern matching, a relative position between the image 73 and the sample 74 when both of them optimally match with each other. When it is determined that the image 73 does not match with the sample 74 by pattern matching (for example, when a matching degree is lower than a threshold), the mobile phone 1A may determine that the contact of the ear is not detected. When the relative position is obtained, the mobile phone 1A calculates the position of the ear based on the relative position and the standard position 74a. In a case of the example in FIG. 6B, the image 73 optimally matches with the sample 74 when the sample 74 is shifted in the X-axis direction by x2 and in the Y-axis direction by y2, using the upper left of the image 73 as a reference. In this case, the position of the ear is calculated as follows: (x1+x2, y1+y2).

This system enables the position of the ear being in contact with the panel 20 to be detected with accuracy. This system also enables to determine, by matching with the sample, whether the object being in contact with the panel 20 is the ear, or whether the object being in contact with the panel 20 is an ear of a person registered in advance. This system also enables to detect detailed information about the contact of the ear such as an orientation and an inclination of the ear.

When the position of the ear is detected by pattern matching, the sample does not need to include the standard position. In the example illustrated in FIG. 6C, the image 73 is pattern-matched with a sample 75 not including the standard position. In a case of the example in FIG. 6C, the image 73 optimally matches with the sample 75 when the sample 75 is shifted in the X-axis direction by x3 and in the Y-axis direction by y3, using the upper left of the image 73 as a reference. In this case, for example, the position of the ear is calculated as follows: (x3, y3).

This system facilitates creation of the sample because the standard position is not included. For example, in a case in which a moving direction and a movement amount of the position of the ear are required and the position of a certain part of the ear does not need to be specified, necessary information can be obtained through this system without setting the standard position in the sample.

The system for detecting the position of the ear being in contact with the panel 20 using the touch screen 21 is not limited to the system described above. Alternatively, another system may be employed.

The setting data 9Z stores therein, as initial coordinates (X, Y), information indicating the position of the ear on the panel 20 (that is, a contact position) detected first by any of the systems described above or another system. For example, when the position of the ear is detected first by the system illustrated in FIG. 6A, coordinates corresponding to the position 72 are stored in the setting data 9Z as the initial coordinates (X, Y). When the position of the ear is detected first by the system illustrated in FIG. 6B, coordinates (x1, y1) corresponding to the standard position 74a are stored in the setting data 9Z as the initial coordinates (X, Y). When the position of the ear is detected first by the system illustrated in FIG. 6C, coordinates (x3, y3) are stored in the setting data 9Z as the initial coordinates (X, Y).

The following describes the control for changing the sound volume performed by the mobile phone 1A during telephone conversation with reference to FIG. 7A to FIG. 8C. In the example illustrated in FIG. 7A to FIG. 7C, for convenience of explanation, the detection region of the touch screen 21 is divided in a grid pattern of 5×5.

In the present embodiment, the mobile phone 1A changes the sound volume through any one of three control processes described below. A first control process is such that the mobile phone 1A changes the sound volume according to a change in the contact position in the longitudinal direction of the panel 20. The first control process will be described below with reference to FIG. 7A, FIG. 8A, and FIG. 9A. A second control process is such that the mobile phone 1A changes the sound volume according to a change in the contact position in the lateral direction of the panel 20. The second control process will be described below with reference to FIG. 7B, FIG. 8B, and FIG. 9B. A third control process is such that the mobile phone 1A changes the sound volume according to a change in the pressing force. The third control process will be described below with reference to FIG. 7C, FIG. 8C, and FIG. 9C.

The following describes the first control process for changing the sound volume performed by the mobile phone 1A with reference to FIG. 7A and FIG. 8A.

As illustrated in FIG. 7A, when the touch screen 21 detects the contact of the ear with the panel 20, the mobile phone 1A detects the position at which the ear is in contact with the panel 20 by any of the systems described above or another system. The mobile phone 1A stores the position of the ear detected first in the setting data 9Z as the initial coordinates (X, Y). At Step S10, when the ear is positioned at the initial coordinates (X, Y) stored in the setting data 9Z, the mobile phone 1A outputs a default sound (standard sound). The default sound is a sound set to a standard sound volume as a reference. A voice "Hello" of the call partner is output with the standard sound at Step S10.

At Step S12, the mobile phone 1A detects that, through the touch screen 21, the ear moves to a position (X, Y+1), which is a position shifted upward from the initial coordinates in the longitudinal direction of the panel 20 by one grid. In this case, at Step S14, the mobile phone 1A controls the electric signal to be applied to the piezoelectric element 7 to change the sound volume to be larger than the standard sound volume by one level. For example, as illustrated in FIG. 8A, the mobile phone 1A controls the electric signal to be applied to the piezoelectric element 7 so that the volume of the vibration sound transmitted from the panel 20 to the ear increases (for example, the sound volume level increases such as +5, +10) as the contact position on the panel 20 of the ear being in contact with the panel 20 approaches an upper end in the longitudinal direction of the panel 20 (for example, the contact position is shifted from the initial coordinates (X, Y) to (X, Y+1), (X, Y+2)). At Step S14, the voice "Hello" of the call partner is output with a larger sound volume by one level.

The volume of the vibration sound is controlled such that the controller 10 changes the amplitude of a voltage (electric signal) applied to the piezoelectric element 7. To reduce the volume of the vibration sound, the controller 10 changes the amplitude of the applied voltage from ±15 V described above to ±13 V, for example. To increase the volume of the vibration sound, the controller 10 changes the amplitude of the applied voltage from ±15 V to ±16 V, for example. The control of the volume of the vibration sound described above is a different concept from a change in magnitude of the vibration corresponding to a distance from the region of the panel 20 to which the piezoelectric element 7 is attached. The vibration of the panel 20 is attenuated as being away from the region to which the piezoelectric element 7 is attached, and the vibration thereof is increased as being close thereto. The controller 10 performs control to change the amplitude of the applied voltage independent of the change in the magnitude of the vibration described above. In this case, the controller 10 preferably changes the amplitude of the applied voltage so that the sound volume is changed by a degree larger than a degree of change in the magnitude of the vibration by the panel 20 itself.

At Step S16, the mobile phone 1A detects that, through the touch screen 21, the ear moves to a position (X, Y−1), which is a position shifted downward from the initial coordinates in the longitudinal direction of the panel 20 by one grid. In this case, at Step S18, the mobile phone 1A controls the electric signal to be applied to the piezoelectric element 7 to change the sound volume to be smaller than the standard sound volume by one level. For example, as illustrated in FIG. 8A, the mobile phone 1A controls the electric signal to be applied to the piezoelectric element 7 so that the volume of the vibration sound transmitted from the panel 20 to the ear decreases (for example, the sound volume level decreases such as −5, −10) as the contact position on the panel 20 of the ear being in contact with the panel 20 approaches a lower end in the longitudinal direction of the panel 20 (for example, the contact position is shifted from the initial coordinates (X, Y) to (X, Y−1), (X, Y−2)). At Step S18, the voice "Hello" of the call partner is output with a sound volume smaller by one level.

In the example illustrated in FIG. 7A and FIG. 8A, even when a coordinate in the X-axis direction is changed, the mobile phone 1A changes the sound volume corresponding to a coordinate in the Y-axis direction irrespective of the change in the coordinate in the X-axis direction.

The following describes the second control process for changing the sound volume performed by the mobile phone 1A with reference to FIG. 7B and FIG. 8B.

As illustrated in FIG. 7B, when the touch screen 21 detects the contact of the ear with the panel 20, the mobile phone 1A detects the position at which the ear is in contact with the panel 20 by any of the systems described above or another system. The mobile phone 1A stores the position of the ear detected first in the setting data 9Z as the initial coordinates (X, Y). At Step S20, when the ear is positioned at the initial coordinates stored in the setting data 9Z, the mobile phone 1A outputs a default sound (standard sound). The voice "Hello" of the call partner is output with the standard sound at Step S20.

At Step S22, the mobile phone 1A detects that, through the touch screen 21, the ear moves to a position (X+1, Y), which is a position shifted rightward from the initial coordinates in the lateral direction of the panel 20 by one grid. In this case, at Step S24, the mobile phone 1A controls the electric signal to be applied to the piezoelectric element 7 to change the sound volume to be larger than the standard sound volume by one level. For example, as illustrated in FIG. 8B, the mobile phone 1A controls the electric signal to be applied to the piezoelectric element 7 so that the volume of the vibration sound transmitted from the panel 20 to the ear increases (for example, the sound volume level increases such as +10, +20) as the contact position on the panel 20 of the ear being in contact with the panel 20 approaches a right end in the lateral direction of the panel 20 (for example, the contact position is shifted from the initial coordinates (X, Y) to (X+1, Y), (X+2, Y)). At Step S24, the voice "Hello" of the call partner is output with a sound volume larger by one level.

At Step S26, the mobile phone 1A detects that, through the touch screen 21, the ear moves to a position (X−1, Y), which is a position shifted leftward from the initial coordinates in the lateral direction of the panel 20 by one grid. In this case, at Step S28, the mobile phone 1A controls the electric signal to be applied to the piezoelectric element 7 to change the sound volume to be smaller than the standard sound volume by one level. For example, as illustrated in FIG. 8B, the mobile phone 1A controls the electric signal to be applied to the piezoelectric element 7 so that the volume of the vibration sound transmitted from the panel 20 to the ear decreases (for example, the sound volume level decreases such as −10, −20) as the contact position on the panel 20 of the ear being in contact with the panel 20 approaches a left end in the lateral direction of the panel 20 (for example, the contact position is shifted from the initial coordinates (X, Y) to (X−1, Y), (X−2, Y)). At Step S28, the voice "Hello" of the call partner is output with a sound volume smaller by one level.

In the example illustrated in FIG. 7B and FIG. 8B, even when the coordinate in the Y-axis direction is changed, the mobile phone 1A changes the sound volume corresponding to the coordinate in the X-axis direction irrespective of the change in the coordinate in the Y-axis direction.

In the present embodiment, the mobile phone 1A may store the changed sound volume level in the setting data 9Z. When detecting the contact position again within a predetermined time based on the detection result of the touch screen 21, the mobile phone 1A may perform processing for changing the sound volume described above from the changed sound volume level.

Figure 7C:
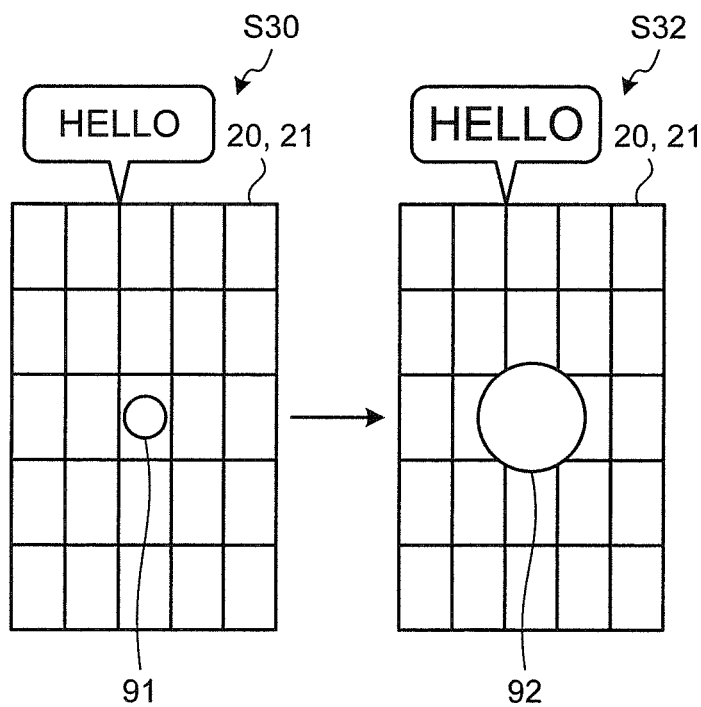
FIG. 7C is a diagram for explaining the control for changing the sound volume.

The following describes the third control process for changing the sound volume performed by the mobile phone 1A with reference to FIG. 7C and FIG. 8C.

As illustrated in FIG. 7C, when the touch screen 21 detects the contact of the ear with the panel 20, the mobile phone 1A calculates the pressing force of the ear that presses the touch screen 21 at a pressing point 91. The pressing force of the ear may be appropriately calculated by various methods. For example, when the touch screen 21 is a resistance film system, the pressing force can be associated with the number of contact points of electrodes facing each other. When the touch screen 21 is an electrostatic capacitance system, the pressing force can be associated with a change in capacitance. The mobile phone 1A then stores the pressing force calculated first in the setting data 9Z as an initial pressure (N). At Step S30, when the pressing force of the ear corresponds to the initial pressure stored in the setting data 9Z, the mobile phone 1A outputs a default sound (standard sound). The voice "Hello" of the call partner is output with the standard sound at Step S30.

At Step S32, when detecting that the pressing force of the ear that presses the touch screen 21 at a pressing point 92 is being increased, the mobile phone 1A controls the electric signal to be applied to the piezoelectric element 7 to change the sound volume to be increased from the standard sound volume corresponding to an increasing amount of the pressing force. For example, as illustrated in FIG. 8C, the mobile phone 1A controls the electric signal to be applied to the piezoelectric element 7 such that the volume of the vibration sound transmitted from the panel 20 to the ear increases (for example, the sound volume level increases such as +20, +40) as the pressing force increases (for example, the pressing force increases such as N+1, N+2). At Step S32, the voice "Hello" of the call partner is output with a sound volume larger by one level.

In the example of FIG. 7C, the mobile phone 1A changes the sound volume to be increased as the pressing force increases. However, the embodiment is not limited thereto. When detecting that the pressing force of the ear that presses the touch screen 21 at the pressing point 91 is being decreased, the mobile phone 1A may control the electric signal to be applied to the piezoelectric element 7 to change the sound volume to be decreased from the standard sound volume corresponding to a decreasing amount of the pressing force. For example, as illustrated in FIG. 8C, the mobile phone 1A controls the electric signal to be applied to the piezoelectric element 7 such that the volume of the vibration sound transmitted from the panel 20 to the ear decreases (for example, the sound volume level decreases such as −20, −40) as the pressing force decreases (for example, the pressing force decreases such as N−1, N−2).

In the example of FIG. 7C, the mobile phone 1A changes the sound volume corresponding to a change in the pressing force detected by the touch screen 21. However, the embodiment is not limited thereto. The mobile phone 1A may detect a contact region of the ear with the touch screen 21 and change the sound volume corresponding to a size of the area of the contact region. In general, an area of the ear being in contact with the panel 20 is considered to be increased as a pressure from the ear of the user being pressed against the panel 20 increases. In this case, the mobile phone 1A controls the electric signal to be applied to the piezoelectric element 7 so that the volume of the vibration sound transmitted from the panel 20 to the ear increases as the area of the contact region increases. The mobile phone 1A controls the electric signal to be applied to the piezoelectric element 7 so that the volume of the vibration sound transmitted from the panel 20 to the ear decreases as the area of the contact region decreases.

With reference to FIG. 9A to FIG. 9C, the following describes a processing procedure of control for changing the sound volume corresponding to the pressing force of the ear or the position of the ear being in contact with the panel 20 when a human body conduction system is utilized. The processing procedure illustrated in FIG. 9A to FIG. 9C is performed when the controller 10 executes the control program 9A.

With reference to FIG. 9A, the following describes a processing procedure of the first control process for changing the sound volume performed by the mobile phone 1A.

As illustrated in FIG. 9A, when a sound is started to be output by vibrating the panel 20 (Step S101), the controller 10 determines whether there is an object being in contact with the panel 20 based on a detection result of the touch screen 21 (Step S102). "When a sound is started to be output" includes, for example, a case in which an operation for starting a sound output by the user is detected, and a case in which processing for outputting a sound is started, such as a telephone call, music reproduction, and moving image reproduction. When there is no object being in contact with the panel 20 (No at Step S102), the process of the controller 10 returns to Step S102, and the controller 10 repeats the process until an object being in contact with the panel 20 is detected.

When there is an object being in contact with the panel 20 (Yes at Step S102), the controller 10 calculates the position of the object being in contact with the panel 20 (that is, the contact position) based on the detection result of the touch screen 21 (Step S103). At Step S103, the controller 10 calculates the position of the object being in contact with the panel 20 using the system illustrated in FIG. 6A to FIG. 6C or the like. The controller 10 then stores the position of the object calculated first in the setting data 9Z as initial coordinates.

When there is an object being in contact with the panel 20, the controller 10 may turn off the display 2 to reduce power consumption. In a case in which the control for turning off the display 2 by the controller 10 is performed in another processing procedure when the proximity sensor 5 detects that a face approaches the display 2, the control for turning off the display 2 does not need to be performed in the present procedure. In general, mobile phones such as a smartphone perform control not to perform contact detection by the touch screen 21 for preventing misoperation in addition to the control for turning off the display 2 when the proximity sensor 5 detects that a face approaches the panel 20. In the present embodiment, the position of the ear being in contact with the panel 20 is detected using the touch screen 21, so that the touch screen 21 is kept operative even when the proximity sensor 5 detects that the face approaches the panel 20.

Subsequently, after storing the initial coordinates in the setting data 9Z, the controller 10 controls the electric signal to be applied to the piezoelectric element 7 and outputs the standard sound (Step S104). The controller 10 then determines, as illustrated in FIG. 7A, whether the contact position of the object is moved in the vertical direction (longitudinal direction of the panel 20) based on the detection result of the touch screen 21 (Step S105).

When it is determined that the contact position of the object is moved in the vertical direction (Yes at Step S105), the controller 10 determines whether the movement of the contact position of the object is toward the upper direction based on the detection result of the touch screen 21 (Step S106). When it is determined that the contact position of the object is moved in the upper direction (Yes at Step S106), as illustrated in FIG. 8A, the controller 10 controls the electric signal to be applied to the piezoelectric element 7 and outputs the sound so that the sound volume increases in proportion to a change in the coordinate values of the contact position (Step S107). Thereafter, the process proceeds to Step S109. On the other hand, when it is determined that the contact position of the object is moved in the lower direction (No at Step S106), as illustrated in FIG. 8A, the controller 10 controls the electric signal to be applied to the piezoelectric element 7 and outputs the sound so that the sound volume decreases in proportion to a change in the coordinate values of the contact position (Step S108). Thereafter, the process proceeds to Step S109. Also when it is determined that the contact position of the object is not moved in the vertical direction at Step S105 (No at Step S105), the process proceeds to Step S109.

Subsequently, the controller 10 determines whether to finish the sound output from the panel 20 (Step S109). Examples of the case of finishing the sound output include, but are not limited to, a case in which an operation for finishing the sound output by the user is detected and a case in which processing for outputting the sound is completed, such as a telephone call, music reproduction, and moving image reproduction.

When the sound output is not finished (No at Step S109), the controller 10 performs Step S105 and following processes again. When the sound output is finished (Yes at Step S109), the controller 10 finishes the processing.

With reference to FIG. 9B, the following describes a processing procedure of the second control process for changing the sound volume performed by the mobile phone 1A.

As illustrated in FIG. 9B, when the sound is started to be output by vibrating the panel 20 (Step S201), the controller 10 determines whether there is an object being in contact with the panel 20 based on the detection result of the touch screen 21 (Step S202). When there is no object being in contact with the panel 20 (No at Step S202), the process of the controller 10 returns to Step S202, and the controller 10 repeats the process until an object being in contact with the panel 20 is detected.

When there is an object being in contact with the panel 20 (Yes at Step S202), the controller 10 calculates the position of the object being in contact with the panel 20 (that is, the contact position) based on the detection result of the touch screen 21 (Step S203). At Step S203, the controller 10 calculates the position of the object being in contact with the panel 20 using the system illustrated in FIG. 6A to FIG. 6C or the like. The controller 10 then stores the position of the object calculated first in the setting data 9Z as the initial coordinates.

Subsequently, after storing the initial coordinates in the setting data 9Z, the controller 10 controls the electric signal to be applied to the piezoelectric element 7 and outputs the standard sound (Step S204). The controller 10 then determines, as illustrated in FIG. 7B, whether the contact position of the object is moved in the horizontal direction (lateral direction of the panel 20) based on the detection result of the touch screen 21 (Step S205).

When it is determined that the contact position of the object is moved in the horizontal direction (Yes at Step S205), the controller 10 determines whether the movement of the contact position of the object is toward the right direction based on the detection result of the touch screen 21 (Step S206). When it is determined that the contact position of the object is moved in the right direction (Yes at Step S206), as illustrated in FIG. 8B, the controller 10 controls the electric signal to be applied to the piezoelectric element 7 and outputs the sound so that the sound volume increases in proportion to a change in the coordinate values of the contact position (Step S207). Thereafter, the process proceeds to Step S209. On the other hand, when it is determined that the contact position of the object is moved in the left direction (No at Step S206), as illustrated in FIG. 8B, the controller 10 controls the electric signal to be applied to the piezoelectric element 7 and outputs the sound so that the sound volume decreases in proportion to a change in the coordinate values of the contact position (Step S208). Thereafter, the process proceeds to Step S209. Also when it is determined that the contact position of the object is not moved in the horizontal direction at Step S205 (No at Step S105), the process proceeds to Step S209.

Subsequently, the controller 10 determines whether to finish the sound output from the panel 20 (Step S209). When the sound output is not finished (No at Step S209), the controller 10 performs Step S205 and following processes again. When the sound output is finished (Yes at Step S209), the controller 10 finishes the processing.

With reference to FIG. 9C, the following describes a processing procedure of the third control process for changing the sound volume performed by the mobile phone 1A.

As illustrated in FIG. 9C, when the sound is started to be output by vibrating the panel 20 (Step S301), the controller 10 determines whether there is an object being in contact with the panel 20 based on the detection result of the touch screen 21 (Step S302). When there is no object being in contact with the panel 20 (No at Step S302), the process of the controller 10 returns to Step S302, and the controller 10 repeats the process until an object being in contact with the panel 20 is detected.

When there is an object being in contact with the panel 20 (Yes at Step S302), the controller 10 calculates the pressing force of the object being in contact with the panel 20 against the panel 20 based on the detection result of the touch screen 21 (Step S303). At Step S303, the controller 10 stores the pressing force of the object calculated first in the setting data 9Z as the initial pressure.

Subsequently, after storing the initial pressure in the setting data 9Z, the controller 10 controls the electric signal to be applied to the piezoelectric element 7 and outputs the standard sound (Step S304). The controller 10 then determines, as illustrated in FIG. 7C, whether there is a change in the pressing force based on the detection result of the touch screen 21 (Step S305).

When it is determined that there is a change in the pressing force (Yes at Step S305), the controller 10 determines whether the pressing force is raised by one level based on the detection result of the touch screen 21 (Step S306). When it is determined that the pressing force is raised by one level (Yes at Step S306), as illustrated in FIG. 8C, the controller 10 controls the electric signal to be applied to the piezoelectric element 7 and outputs the sound so that the sound volume increases in proportion to the change in the pressing force (Step S307). Thereafter, the process proceeds to Step S309. On the other hand, when it is determined that the pressing force is lowered by one level (No at Step S306), as illustrated in FIG. 8C, the controller 10 controls the electric signal to be applied to the piezoelectric element 7 and outputs the sound so that the sound volume decreases in proportion to the change in the pressing force (Step S308). Thereafter, the process proceeds to Step S309. Also when it is determined that there is no change in the pressing force at Step S305 (No at Step S305), the process proceeds to Step S309.

Subsequently, the controller 10 determines whether to finish the sound output from the panel 20 (Step S309). When the sound output is not finished (No at Step S309), the controller 10 performs Step S305 and following processes again. When the sound output is finished (Yes at Step S309), the controller 10 finishes the processing.

With the control as described above, the user can change the sound volume to be easily heard while checking the sound by moving the mobile phone 1A keeping the ear being in contact with the panel 20. Accordingly, the user does not need to temporarily move the ear away from the panel 20 to change the sound volume, which can reduce the possibility of failing to hear part of the sound. With such control, the user does not need to repeat a time-consuming operation that has been conventionally performed until the sound volume is changed to a suitable level, such as adjusting the sound volume while detaching the ear and bringing the ear in contact with the panel again to check the sound volume. Accordingly, the user can easily and quickly change the sound volume to a suitable level when utilizing the mobile phone 1A.

In the above embodiment, described is an example in which the mobile phone 1A changes the sound volume performing any one of the three control processes. Alternatively, the mobile phone 1A may appropriately combine the three control processes. In this case, as illustrated in FIG. 8A to FIG. 8C, the mobile phone 1A can perform control while differentiating a change amount of the sound volume level corresponding to each of a change in the contact position in the longitudinal direction, a change in the contact position in the lateral direction, and a change in the pressing force. Accordingly, the user can minutely change the sound volume by appropriately combining moving operations of the mobile phone 1A while the ear is kept in contact with the panel 20.

Second Embodiment

The above embodiment describes the control for changing the sound volume corresponding to the pressing force of the ear or the position of the ear being in contact with the panel 20 when the human body conduction system is utilized. The mobile phone 1A can also change the tone and the speech speed in addition to the sound volume corresponding to the position of the ear and the pressing force of the ear as illustrated in FIG. 10A to FIG. 10C. FIG. 10A is a diagram illustrating an example of the change in the sound volume. FIG. 10B is a diagram illustrating an example of the change in the tone. FIG. 10C is a diagram illustrating an example of the change in the speech speed.

In these examples, as illustrated in FIG. 10A, the controller 10 controls the electric signal to be applied to the piezoelectric element 7 so that the volume of the vibration sound transmitted from the panel 20 to the object is changed corresponding to the change in the contact position in a first direction of the panel 20. The first direction is, for example, the longitudinal direction of the panel 20. As illustrated in FIG. 10B, the controller 10 controls the electric signal to be applied to the piezoelectric element 7 so that the tone of the vibration sound transmitted from the panel 20 to the object is changed corresponding to the change in the contact position in a second direction of the panel 20. The tone means a frequency. The second direction is, for example, the lateral direction of the panel 20. As illustrated in FIG. 10C, the controller 10 controls the electric signal to be applied to the piezoelectric element 7 so that the speech speed of the vibration sound transmitted from the panel 20 to the object is changed corresponding to the change in the pressing force.

With reference to FIG. 11, the following describes the control performed by the mobile phone 1A for changing the sound volume, the tone, and the speech speed corresponding to the position of the ear and the pressing force of the ear as illustrated in FIG. 10A to FIG. 10C. FIG. 11 is a flowchart illustrating a processing procedure of the control for changing the sound volume, the tone, and the speech speed.

As illustrated in FIG. 11, when the sound is started to be output by vibrating the panel 20 (Step S401), the controller 10 determines whether there is an object being in contact with the panel 20 based on the detection result of the touch screen 21 (Step S402). When there is no object being in contact with the panel 20 (No at Step S402), the process of the controller 10 returns to Step S402, and the controller 10 repeats the process until an object being in contact with the panel 20 is detected.

When there is an object being in contact with the panel 20 (Yes at Step S402), the controller 10 calculates the position of the object being in contact with the panel 20 based on the detection result of the touch screen 21 (Step S403). At Step S403, the controller 10 calculates the position of the object being in contact with the panel 20 using the system illustrated in FIG. 6A to FIG. 6C or the like. The controller 10 then stores the position of the object calculated first in the setting data 9Z as the initial coordinates. Subsequently, the controller 10 calculates the pressing force of the object being in contact with the panel 20 against the panel 20 based on the detection result of the touch screen 21 (Step S404). At Step S404, the controller 10 stores the pressing force of the object calculated first in the setting data 9Z as the initial pressure. After storing the initial coordinates and the initial pressure in the setting data 9Z, the controller 10 controls the electric signal to be applied to the piezoelectric element 7 and outputs the standard sound (Step S405).

The controller 10 then determines, as illustrated in FIG. 7A, whether the contact position of the object is moved in the vertical direction (longitudinal direction of the panel 20) based on the detection result of the touch screen 21 (Step S406).

When it is determined that the contact position of the object is moved in the vertical direction (Yes at Step S406), the controller 10 determines whether the movement of the contact position of the object is toward the upper direction based on the detection result of the touch screen 21 (Step S407). When it is determined that the contact position of the object is moved in the upper direction (Yes at Step S407), as illustrated in FIG. 10A, the controller 10 performs adjustment processing for changing a set value so that the sound volume increases in proportion to a change in the coordinate values of the contact position (Step S408). Thereafter, the process proceeds to Step S410. On the other hand, when it is determined that the contact position of the object is moved in the lower direction (No at Step S407), as illustrated in FIG. 10A, the controller 10 performs adjustment processing for changing the set value so that the sound volume decreases in proportion to a change in the coordinate values of the contact position (Step S409). Thereafter, the process proceeds to Step S410. Also when it is determined that the contact position of the object is not moved in the vertical direction at Step S406 (No at Step S406), the process proceeds to Step S410.

The controller 10 then determines, as illustrated in FIG. 7B, whether the contact position of the object is moved in the horizontal direction (lateral direction of the panel 20) based on the detection result of the touch screen 21 (Step S410).

When it is determined that the contact position of the object is moved in the horizontal direction (Yes at Step S410), the controller 10 determines whether the movement of the contact position of the object is toward the right direction based on the detection result of the touch screen 21 (Step S411). When it is determined that the contact position of the object is moved in the right direction (Yes at Step S411), as illustrated in FIG. 10B, the controller 10 performs high-pitched processing for changing the set value so that the frequency increases in proportion to a change in the coordinate values of the contact position (Step S412). Thereafter, the process proceeds to Step S414. On the other hand, when it is determined that the contact position of the object is moved in the left direction (No at Step S411), as illustrated in FIG. 10B, the controller 10 performs low-pitched processing for changing the set value so that the frequency decreases in proportion to a change in the coordinate values of the contact position (Step S413). Thereafter, the process proceeds to Step S414. Also when it is determined that the contact position of the object is not moved in the horizontal direction at Step S410 (No at Step S410), the process proceeds to Step S414.

The controller 10 then determines, as illustrated in FIG. 7C, whether there is a change in the pressing force based on the detection result of the touch screen 21 (Step S414). When it is determined that there is no change in the pressing force (No at Step S414), the process of the controller 10 proceeds to Step S420.

When it is determined that there is a change in the pressing force (Yes at Step S414), the controller 10 starts sound buffer processing to change the speech speed (Step S415). The controller 10 then determines whether the pressing force is raised by one level based on the detection result of the touch screen 21 (Step S416). When it is determined that the pressing force is raised by one level (Yes at Step S416), as illustrated in FIG. 10C, the controller 10 performs high-speed output processing of a buffering sound for changing the set value so that the speech speed increases in proportion to the change in the pressing force (Step S417). Thereafter, the process proceeds to Step S419. On the other hand, when it is determined that the pressing force is lowered by one level (No at Step S416), as illustrated in FIG. 10C, the controller 10 performs low-speed output processing of the buffering sound for changing the set value so that the speech speed decreases in proportion to the change in the pressing force (Step S418). Thereafter, the process proceeds to Step S419.

Subsequently, the controller 10 determines whether there is a further change in the pressing force within a predetermined time (Step S419). When it is determined that there is a further change in the pressing force within the predetermined time (Yes at Step S419), the controller 10 performs Step S416 and following processes again. On the other hand, when it is determined that there is no further change in the pressing force within the predetermined time (No at Step S419), the controller 10 outputs the sound corrected by the processing at Steps S408, S409, S412, S413, S417, and S418 by controlling the electric signal to be applied to the piezoelectric element 7 (Step S420). The controller 10 then determines whether to finish the sound output from the panel 20 (Step S421). When the sound output is not finished (No at Step S421), the controller 10 performs Step S406 and following processes again. When the sound output is finished (Yes at Step S421), the controller 10 finishes the processing.

With the control as described above, as illustrated in FIG. 10A to FIG. 10C, the mobile phone 1A can change the sound volume, the tone, and the speech speed corresponding to a change in the contact position in the first direction, a change in the contact position in the second direction, and a change in the pressing force, respectively. Accordingly, the user can change the sound volume, the tone, and the speech speed to be a suitable combination for providing the sound to be easily heard by appropriately combining moving operations of the mobile phone 1A while the ear is kept in contact with the panel 20.

FIG. 10B illustrates an example in which a high-pitched level is changed to emphasize a high frequency of the tone and an example in which a low-pitched level is changed to emphasize a low frequency of the tone. However, the embodiment is not limited thereto. The mobile phone 1A may change the set values related to preset equalizing processing, change processing to tone specific to women and tone specific to men, and noise cancellation processing, corresponding to the contact position or the pressing force.

In FIG. 10A to FIG. 11, the sound volume, the tone, and the speech speed are illustrated as an example of parameters related to the sound. However, the parameters are not limited thereto. The mobile phone 1A may change directivity of the sound corresponding to a change in the contact position in the first direction, a change in the contact position in the second direction, or a change in the pressing force. For example, the mobile phone 1A changes the directivity of the sound by controlling an angle or a direction of an oscillator corresponding to a change in the contact position or a change in the pressing force. In addition, when the mobile phone 1A is configured with a bendable electronic paper and the like, the mobile phone 1A may change the directivity of the sound to be easily heard by the user using an actuator and the like that can adjust a bending degree corresponding to a change in the contact position or a change in the pressing force.

In the processing illustrated in FIG. 11, the mobile phone 1A may start buffering when a telephone call is started, or may start buffering each time a call partner's voice is detected.

Third Embodiment

Figure 12:
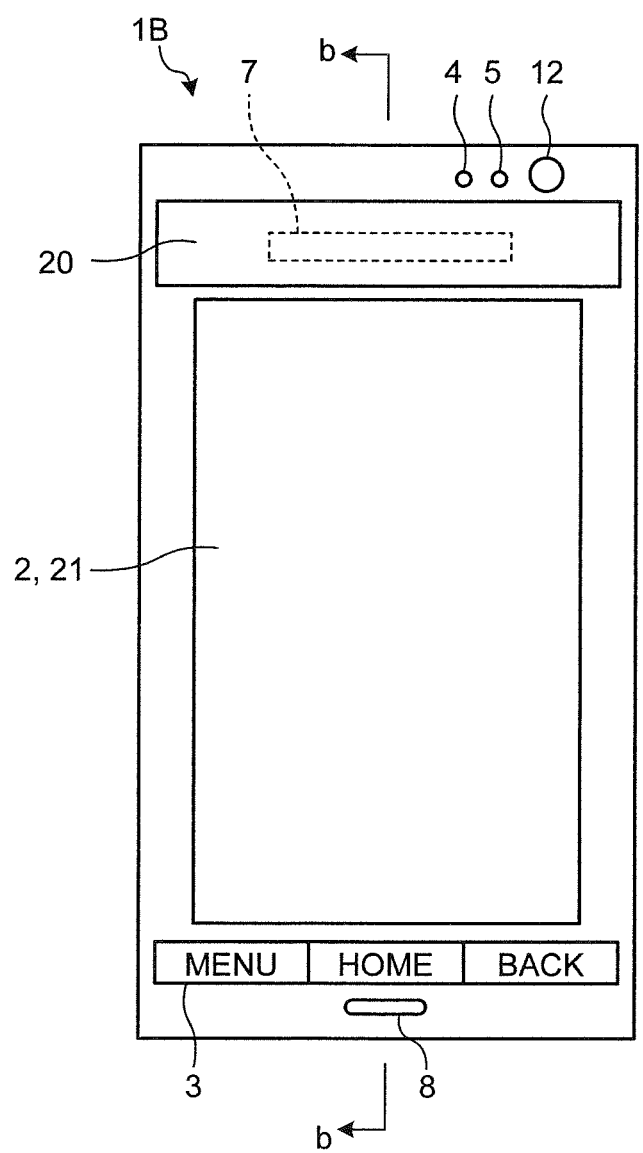
FIG. 12 is a front view of a mobile phone according to a third embodiment.
Figure 13:
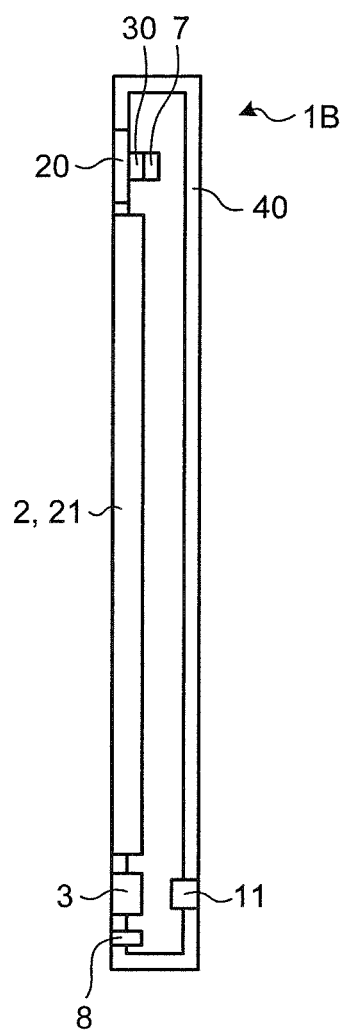
FIG. 13 is a cross-sectional view of the mobile phone according to the third embodiment.

In the above embodiment, described is an example in which the touch screen 21 is arranged on substantially the entire surface of the panel 20. Alternatively, the touch screen 21 may be arranged so as not to be overlapped with the panel 20. FIG. 12 is a front view of a mobile phone 1B of which touch screen 21 is arranged so as not to be overlapped with the panel 20. FIG. 13 is a cross-sectional view schematically illustrating a cross-section along b-b line of the mobile phone 1B.

As illustrated in FIG. 12 and FIG. 13, the display 2 of the mobile phone 1B is arranged side by side with the panel 20 to be flush therewith, not inside the panel 20. The touch screen 21 is arranged to cover substantially the entire front surface of the display 2. That is, the touch screen 21 and the display 2 configure what is called a touch panel (touch screen display).

The piezoelectric element 7 is attached to substantially the center of the back surface of the panel 20 with the joining member 30. When the electric signal is applied to the piezoelectric element 7, the panel 20 is vibrated corresponding to deformation (expansion/contraction or bend) of the piezoelectric element 7, and generates an air conduction sound and a vibration sound transmitted via part of a human body (for example, the auricular cartilage) being in contact with the panel 20. By arranging the piezoelectric element 7 at the center of the panel 20, the vibration of the piezoelectric element 7 is uniformly transmitted to the entire panel 20, and the quality of the air conduction sound and the vibration sound is improved.

Although the touch screen 21 is not arranged on the front surface of the panel 20, the panel 20 is arranged near the display 2 on which the touch screen 21 is arranged.

Figure 14:
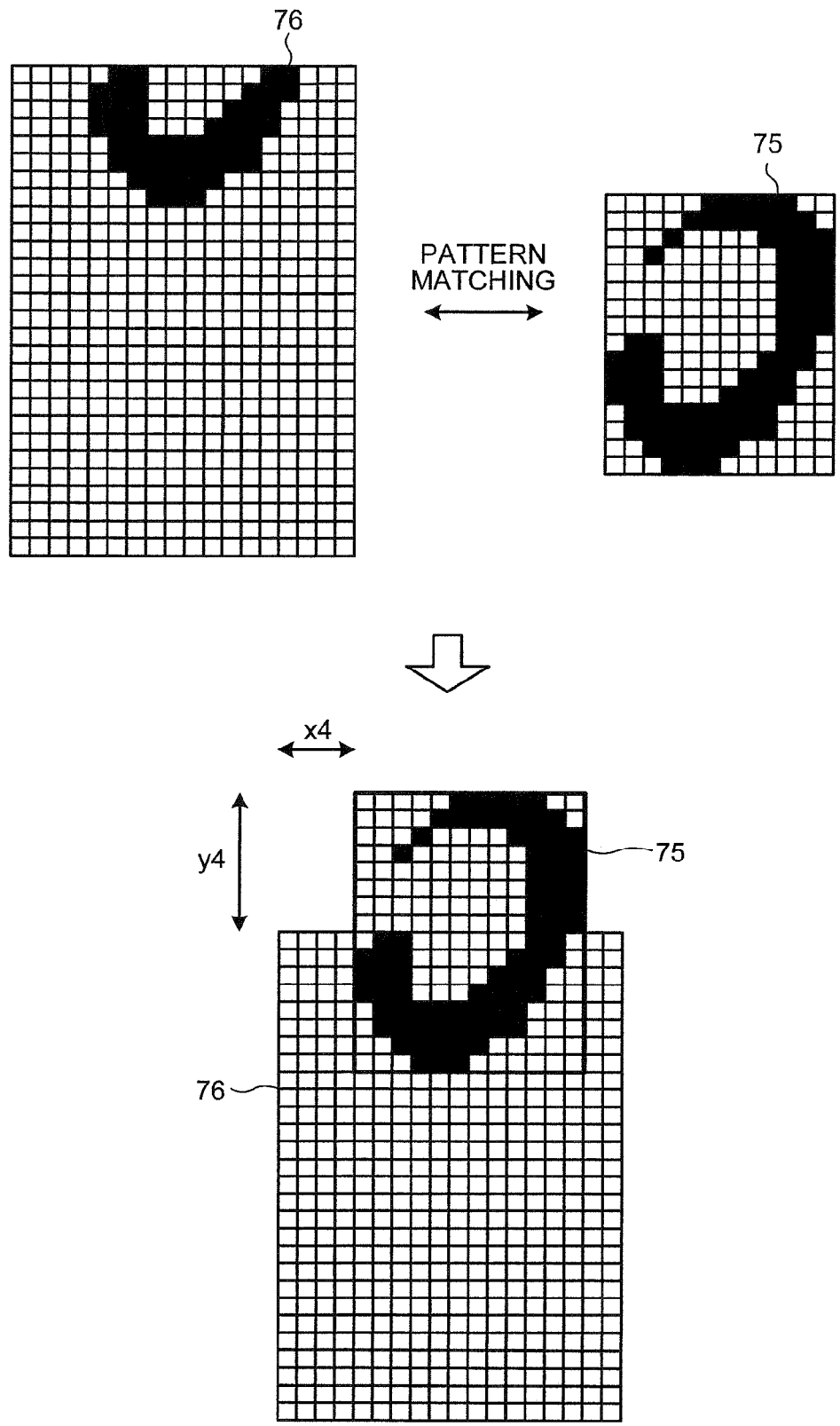
FIG. 14 is a diagram for explaining the detection of the position of the ear.

When the user of the mobile phone 1B having such configuration brings his/her ear into contact with the panel 20 to listen to the vibration sound, part of his/her ear comes into contact with the touch screen 21 because the panel 20 is arranged near the touch screen 21. Accordingly, an image 76 as illustrated in FIG. 14 can be obtained by dividing the detection region of the touch screen 21 in a grid pattern and converting a detection state of the contact of the ear in each of the divided regions into a state of a corresponding pixel.

When the image 76 is obtained, the mobile phone 1B obtains, by pattern matching, a relative position between the image 76 and the sample 75 when both of them optimally match with each other. In a case of the example in FIG. 14, the image 76 optimally matches with the sample 75 when the sample 75 is shifted in the X-axis direction by x4 and in the Y-axis direction by −y4, using the upper left of the image 76 as a reference. In this case, the position of the ear is calculated as follows: (x4, −y4). The mobile phone 1B can also detect the position of the ear using the sample 74 including the standard position 74a.

As described above, even when the touch screen 21 is arranged so as not to be overlapped with the panel 20, the mobile phone 1B can detect the position of the ear being in contact with the panel 20 using the touch screen 21. Accordingly, similarly to the mobile phone 1A, the mobile phone 1B can perform control for changing the sound volume corresponding to the position of the ear being in contact with the panel 20.

Fourth Embodiment

Figure 15:
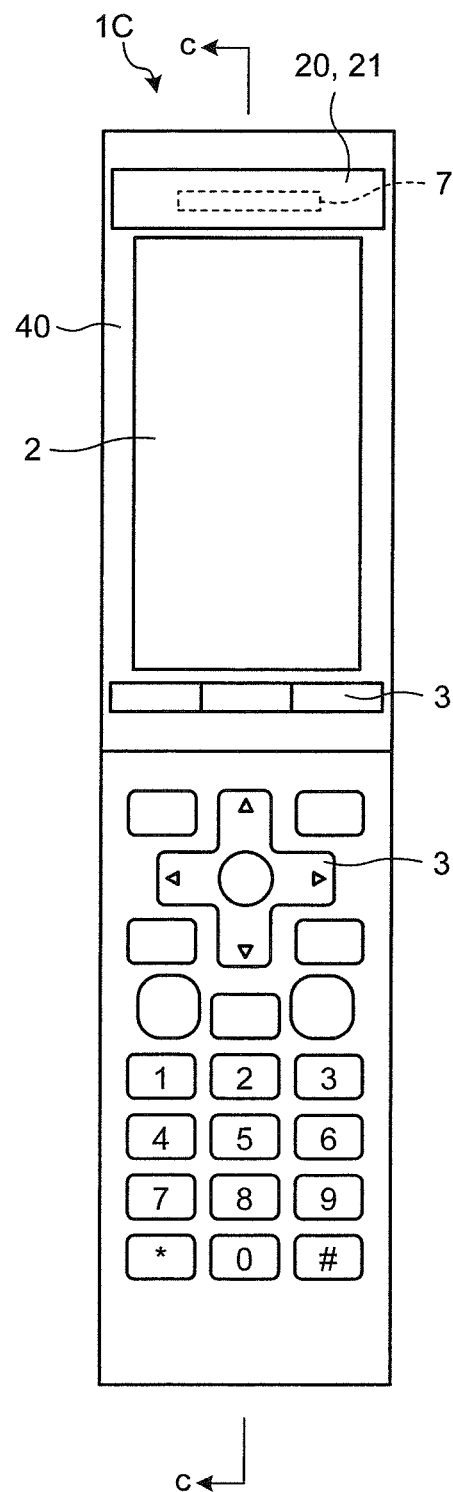
FIG. 15 is a front view of a mobile phone according to a fourth embodiment.
Figure 16:
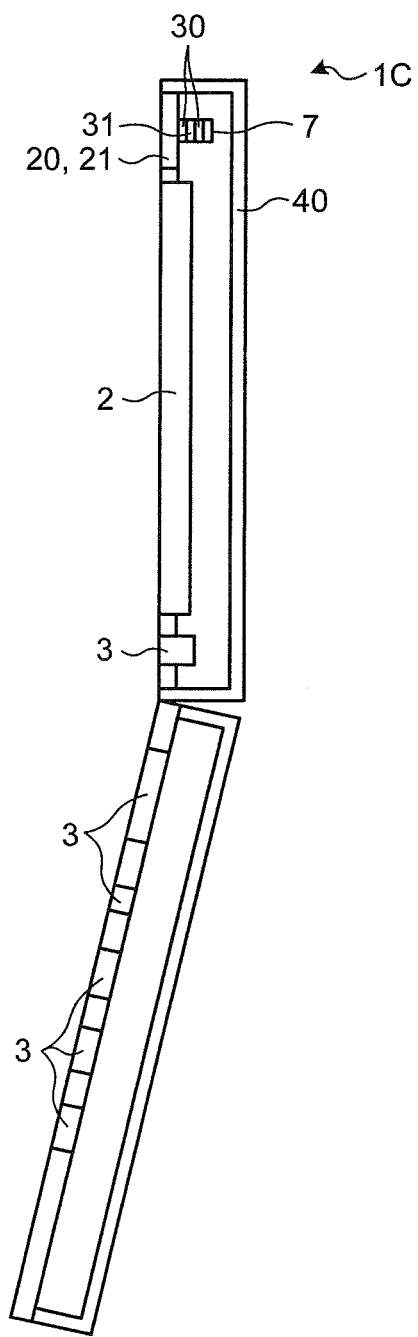
FIG. 16 is a cross-sectional view of the mobile phone according to the fourth embodiment.

In the above embodiment, described is an example in which at least part of the touch screen 21 is arranged to be overlapped with the display 2. Alternatively, the touch screen 21 may be arranged so as not to be overlapped with the display 2. FIG. 15 is a front view of a mobile phone 1C of which touch screen 21 is arranged so as not to be overlapped with the display 2. FIG. 16 is a cross-sectional view schematically illustrating a cross-section along c-c line of the mobile phone 1C.

As illustrated in FIG. 15 and FIG. 16, the display 2 of the mobile phone 1C is arranged side by side with the panel 20 to be flush therewith, not inside the panel 20.

The piezoelectric element 7 is attached to substantially the center of the back surface of the panel 20 with the joining member 30. The reinforcing member 31 is arranged between the panel 20 and the piezoelectric element 7. That is, in the mobile phone 1C, the piezoelectric element 7 is bonded to the reinforcing member 31 with the joining member 30, and the reinforcing member 31 is bonded to the panel 20 with the joining member 30.

The reinforcing member 31 is an elastic member made of rubber or silicon, for example. The reinforcing member 31 may be, for example, a metal plate made of aluminum and the like having a certain degree of elasticity. The reinforcing member 31 may be, for example, a stainless steel plate such as SUS304. A thickness of the metal plate such as a stainless steel plate is, for example, 0.2 millimeter to 0.8 millimeter, which is appropriately used corresponding to a voltage value and the like applied to the piezoelectric element 7. The reinforcing member 31 may be, for example, a resin plate. Examples of the resin for forming the resin plate include, but are not limited to, a polyamide resin. Examples of the polyamide resin include, but are not limited to, Reny (registered trademark) that is made of a crystalline thermoplastic resin obtained from metaxylylene diamine and adipic acid and has high strength and elasticity. Such a polyamide resin may be a reinforced resin reinforced with glass fiber, metallic fiber, carbon fiber, or the like using the polyamide resin itself as a base polymer. The strength and the elasticity of the reinforced resin are appropriately adjusted corresponding to an amount of the glass fiber, the metallic fiber, the carbon fiber, or the like added to the polyamide resin. The reinforced resin is formed by, for example, impregnating a base material with a resin to cure it, the base material being formed by knitting the glass fiber, the metallic fiber, the carbon fiber, or the like. The reinforced resin may be formed by mixing finely cut fiber fragments in liquid resin and curing it. The reinforced resin may be formed by laminating a resin layer and a base material in which fibers are knitted in.

The following advantageous effects can be obtained by arranging the reinforcing member 31 between the piezoelectric element 7 and the panel 20. When an external force is applied to the panel 20, it is possible to reduce the possibility that the external force is transmitted to the piezoelectric element 7 and the piezoelectric element 7 is damaged. For example, when the mobile phone 1C falls on the ground and the external force is applied to the panel 20, the external force is first transmitted to the reinforcing member 31. The reinforcing member 31 has certain elasticity, so that it is elastically deformed by the external force transmitted from the panel 20. Accordingly, at least part of the external force applied to the panel 20 is absorbed by the reinforcing member 31, which reduces the external force transmitted to the piezoelectric element 7. Due to this, it is possible to reduce the possibility that the piezoelectric element 7 is damaged. In a case in which the reinforcing member 31 is arranged between the piezoelectric element 7 and the housing 40, it is possible to reduce the possibility that, for example, the mobile phone 1C falls on the ground to deform the housing 40, and the deformed housing 40 collides with and damages the piezoelectric element 7.

The vibration caused by the expansion/contraction or bent of the piezoelectric element 7 is transmitted, first of all, to the reinforcing member 31, and further to the panel 20. That is, the piezoelectric element 7 vibrates, first of all, the reinforcing member 31 having an elastic modulus larger than that of the piezoelectric element 7, and thereafter vibrates the panel 20. Accordingly, the piezoelectric element 7 of the mobile phone 1C is not excessively deformed as compared to a structure without the reinforcing member 31 in which the piezoelectric element 7 is joined to the panel 20 with the joining member 30. Due to this, a deformation amount (degree of deformation) of the panel 20 can be adjusted. This structure is especially effective for the panel 20 that hardly inhibits the deformation of the piezoelectric element 7.

Figure 17:
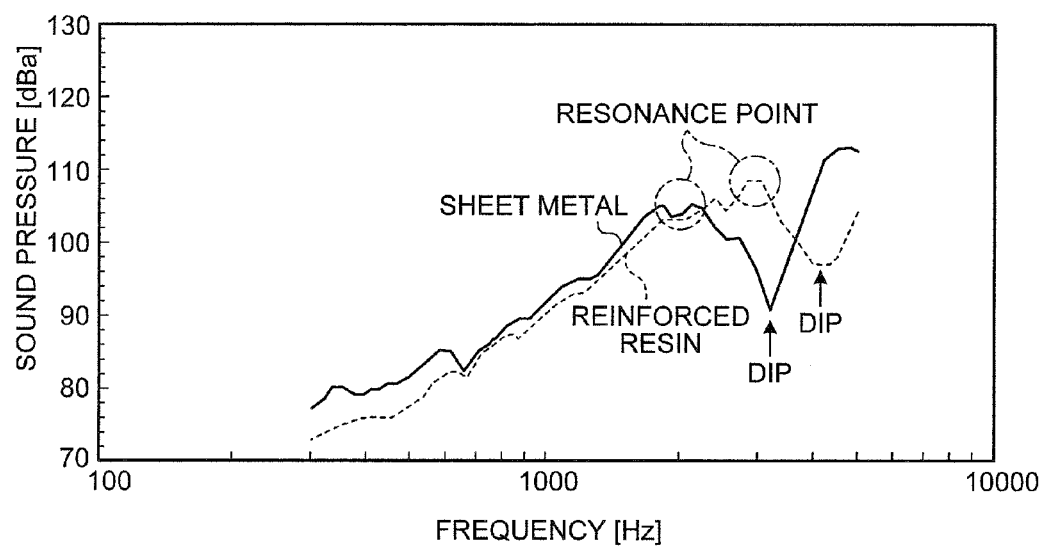
FIG. 17 is a diagram illustrating an example of a resonance frequency of the panel.

By arranging the reinforcing member 31 between the piezoelectric element 7 and the panel 20, as illustrated in FIG. 17, a resonance frequency of the panel 20 is lowered and an acoustic characteristic of a low frequency band is improved. FIG. 17 is a diagram illustrating an example of a change in a frequency characteristic caused by the reinforcing member 31. FIG. 17 illustrates the frequency characteristic in a case of using the sheet metal such as SUS304 described above as the reinforcing member 31, and the frequency characteristic in a case of using the reinforced resin such as Reny described above as the reinforcing member 31. The horizontal axis represents a frequency and the vertical axis represents a sound pressure. A resonance point in a case of using the reinforced resin is about 2 kHz, and a resonance point in a case of using the sheet metal is about 1 kHz. A dip in a case of using the reinforced resin is about 4 kHz, and a dip in a case of using the sheet metal is about 3 kHz. That is, in the case of using the reinforced resin, the resonance point of the panel 20 is positioned in a higher frequency region and the dip of the frequency characteristic is positioned in a higher frequency region than those in the case of using the sheet metal. A frequency band used for voice communication with a mobile phone is 300 Hz to 3.4 kHz, and therefore the dip can be prevented from being included in a use frequency band of the mobile phone 1C in the case of using the reinforced resin as the reinforcing member 31. Even when the sheet metal is used as the reinforcing member 31, the dip can be prevented from being included in the use frequency band of the mobile phone 1C by appropriately adjusting a type or composition of metal constituting the sheet metal, the thickness of the sheet metal, or the like. Comparing the sheet metal with the reinforced resin, influence of the reinforced resin on antenna performance is less than that of the sheet metal. Advantageously, the acoustic characteristic is not easily changed with the reinforced resin because the reinforced resin is not easily plastically deformed as compared to the sheet metal. A temperature rise in sound generation is suppressed with the reinforced resin as compared to the sheet metal. A plate-shaped weight may be attached to the piezoelectric element 7 with the joining member 30 instead of the reinforcing member 31.

When the electric signal is applied to the piezoelectric element 7, the panel 20 is vibrated corresponding to the deformation (expansion/contraction or bend) of the piezoelectric element 7, and generates the air conduction sound and the vibration sound transmitted via part of a human body (for example, the auricular cartilage) being in contact with the panel 20. The touch screen 21 is arranged to cover substantially the entire front surface of the panel 20.

Figure 18:
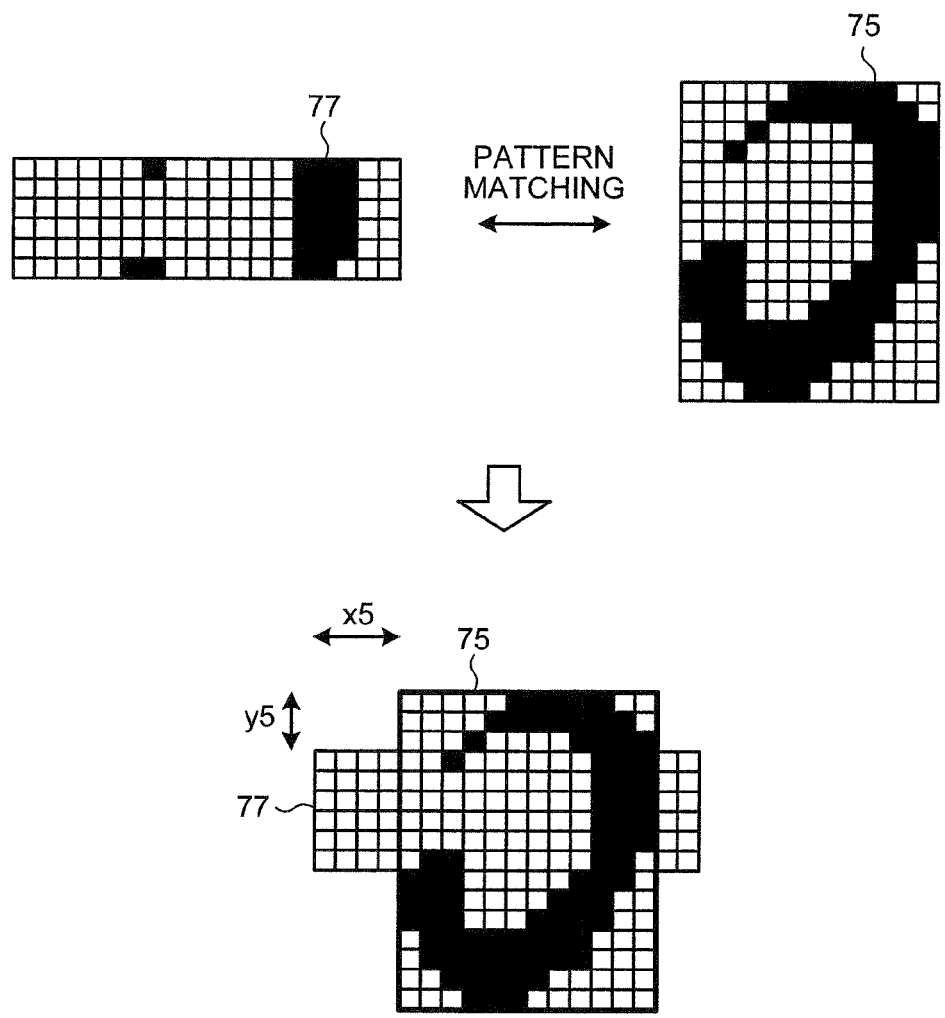
FIG. 18 is a diagram for explaining the detection of the position of the ear.

When the user of the mobile phone 1C having such a configuration brings his/her ear into contact with the panel 20 to listen to the vibration sound, part of the ear comes into contact with the touch screen 21 even though the touch screen 21 is smaller than the ear. Accordingly, an image 77 as illustrated in FIG. 18 can be obtained by dividing a detection region of the touch screen 21 in a grid pattern and converting a detection state of the contact of the ear in each of the divided regions into a state of a corresponding pixel.

When the image 77 is obtained, the mobile phone 1C obtains, by pattern matching, a relative position between the image 77 and the sample 75 when both of them optimally match with each other. In a case of the example in FIG. 18, the image 77 optimally matches with the sample 75 when the sample 75 is shifted in the X-axis direction by x5 and in the Y-axis direction by −y5, using the upper left of the image 77 as a reference. In this case, the position of the ear is calculated as follows: (x5, −y5). The mobile phone 1C can also detect the position of the ear using the sample 74 including the standard position 74a.

As described above, even when the touch screen 21 is arranged so as not to be overlapped with the display 2, the mobile phone 1C can detect the position of the ear being in contact with the panel 20 using the touch screen 21. Accordingly, similarly to the mobile phone 1A, the mobile phone 1C can perform control for changing the sound volume corresponding to the position of the ear being in contact with the panel 20.

Other Embodiments

The embodiments disclosed herein can include obvious knowledge of those skilled in the art, and can be modified within a range not departing from the gist and scope of the invention. The embodiments disclosed herein and the modification thereof can be appropriately combined. For example, the embodiments described above may be modified as follows.

For example, each computer program illustrated in FIG. 5 may be divided into a plurality of modules or may be combined with the other computer program.

In the example of above embodiments, the position of the object being in contact with the panel 20 is detected using the touch screen 21. However, a detection unit for detecting the position of the object is not limited to the touch screen 21. For example, the detection unit for detecting the position of the object may be the camera 12. In this case, the position of the object is detected based on an image obtained by the camera 12.

In the example of above embodiments, the movement of the object being in contact with the panel 20 is detected using the touch screen 21. However, the detection unit for detecting the movement of the object is not limited to the touch screen 21. For example, the movement of the object may be detected based on the image obtained by the camera 12 or may be detected by the acceleration sensor included in the attitude detection unit 15.

In the example of above embodiments, the sound volume is adjusted assuming that the object being in contact with the panel 20 is an ear. However, the mobile phones 1A to 1C may determine whether the object being in contact with the panel 20 is an ear to adjust the sound volume only when the object is an ear. In this way, the control process can be switched depending on a situation such that the sound volume is adjusted corresponding to the position of the ear when the ear is in contact with the panel 20, and processing corresponding to a contact operation is performed when a finger is in contact with the panel 20. It is possible to determine whether the object being in contact with the panel 20 is an ear by increasing accuracy of pattern matching with the sample, for example.

In the example of above embodiments, the mobile phone changes the volume of the vibration sound corresponding to the contact area or the contact position of the ear with the panel 20, or the pressing force of the ear. However, the embodiment is not limited thereto. The mobile phone may change the volume of the vibration sound corresponding to, for example, the number of times the ear comes into contact with the panel 20 within a predetermined time. Alternatively, the volume of the vibration sound may be changed corresponding to an image imaged by the camera 12 in a state in which the ear is in contact with the panel 20 or the detection result of the attitude detection unit 15.

In the example of the above embodiments, corresponding to a change in the position from the initial coordinates, the mobile phone changes the volume of the vibration sound according to a change amount associated with the change in the position. However, the embodiment is not limited thereto. When detecting the contact position of the ear, the mobile phone may change the volume of the vibration sound to a predetermined sound volume associated with the position on the panel 20. When contact with a second position is detected after contact with a first position is detected, the volume of the vibration sound may be changed based on a time interval between the detection of the contact with the first position and the detection of the contact with the second position. The volume of the vibration sound may also be changed based on a direction (vector) from the first position to the second position.

In the example of the above embodiments, the display 2 is attached to the back surface of the panel 20 with the joining member 30 in the mobile phone 1A. Alternatively, the mobile phone 1A may be configured such that there is a space between the panel 20 and the display 2. By providing a space between the panel 20 and the display 2, the panel 20 is easily vibrated, and a range in which the vibration sound can be easily heard is widened on the panel 20.

In the example of the above embodiments, the piezoelectric element 7 is attached to the panel 20. Alternatively, the piezoelectric element 7 may be attached to another place. For example, the piezoelectric element 7 may be attached to a battery lid. The battery lid is a member attached to the housing 40 to cover a battery. The battery lid is typically attached to a surface different from the display 2 in a mobile electronic device such as a mobile phone. According to such a configuration, the user can listen to the sound by bringing part of his/her body (for example, an ear) into contact with the surface different from the display 2. The piezoelectric element 7 may be configured to vibrate a corner part (for example, at least one of four corners) of the housing 40. In this case, the piezoelectric element 7 may be configured to be attached to an inner surface of the corner part of the housing 40, or may be configured such that an intermediate member is further provided and the vibration of the piezoelectric element 7 is transmitted to the corner part of the housing 40 via the intermediate member. According to such a configuration, a vibration range can be relatively narrowed, so that the air conduction sound caused by the vibration does not easily leak out. In addition, according to this configuration, the air conduction sound and the vibration sound are transmitted to the user in a state in which the user inserts the corner part of the housing 40 into the external auditory meatus, so that surrounding noises are not easily transmitted to the external auditory meatus of the user. Accordingly, the quality of the sound transmitted to the user can be improved.

In the above embodiment, the reinforcing member 31 is a plate member. However, the shape of the reinforcing member 31 is not limited thereto. The reinforcing member 31 may be, for example, larger than the piezoelectric element 7, and an end thereof may be curved to the piezoelectric element 7 side to cover a side of the piezoelectric element 7. The reinforcing member 31 may include, for example, a plate portion and an extended portion that is extended from the plate portion to cover the side of the piezoelectric element 7. In this case, the extended portion is preferably separated from the side of the piezoelectric element 7 by a predetermined distance. Due to this, the extended portion hardly inhibits the deformation of the piezoelectric element 7.

The panel 20 may constitute part of or the entire of any of a display panel, an operation panel, a cover panel, and a lid panel that enables a rechargeable battery to be removable. Specifically, in a case in which the panel 20 is the display panel, the piezoelectric element 7 is arranged at the outside of a display region for a display function. Due to this, there is an advantage that the display is hardly inhibited. Examples of the operation panel include a touch panel. Examples of the operation panel further include a sheet key that is a member constituting a surface of a housing on an operating unit side in which key tops of operation keys are integrally formed in a folding mobile phone, for example.

The joining member that bonds the panel 20 to the piezoelectric element 7, the joining member that bonds the panel 20 to the housing 40, and the like are described above as the joining member 30 having the same reference numeral. However, a different joining member may be appropriately used corresponding to a member to be bonded.

In the above embodiments, the mobile phone is described as an example of a device according to the appended claims. However, the device according to the appended claims is not limited to the mobile phone. The device according to the appended claims may be a mobile electronic device other than the mobile phone. Examples of the mobile electronic device include, but are not limited to, a tablet, a portable personal computer, a digital camera, a media player, an electronic book reader, a navigator, and a gaming device.

The characteristic embodiments have been described above to completely and clearly disclose the technique according to the appended claims. However, the appended claims are not limited to the embodiments described above. The appended claims should be configured to realize all modifications and alternative configurations conceivable by those skilled in the art within a range of basic items disclosed in this specification.

The invention claimed is:

1. An electronic device, comprising:
a piezoelectric element;
a sound generating unit that is vibrated by the piezoelectric element and generates a vibration sound to be transmitted while vibrating part of a human body; and
a detection unit that detects contact of the part of the human body with the sound generating unit, wherein
a volume of the vibration sound is changed corresponding to a detection result of the detection unit,
the volume of the vibration sound is changed when the part of the human body is an ear,
the detection unit detects a contact range of the part of the human body with the sound generating unit, and
the detection unit determines whether the part of the human body is the ear based on the detected contact range, wherein
the sound generating unit comprises a plurality of portions vibrated in a direction intersecting with a principal plane of the sound generating unit in a vibrating region thereof, and
a value of an amplitude of the vibration is changed from positive to negative or vice versa with time, at each of the portions.

2. The electronic device according to claim 1, wherein
the detection unit detects a contact position of the part of the human body with the sound generating unit, and
the volume of the vibration sound is changed corresponding to the contact position detected by the detection unit.

3. The electronic device according to claim 2, wherein
the volume of the vibration sound increases as the contact position approaches one end of the sound generating unit, and
the volume of the vibration sound decreases as the contact position approaches the other end of the sound generating unit.

4. The electronic device according to claim 3, wherein the volume of the vibration sound is changed to a sound volume associated with a position on the sound generating unit.

5. The electronic device according to claim 3, wherein the volume of the vibration sound is changed corresponding to a movement amount of the contact position with time.

6. The electronic device according to claim 1, wherein
the detection unit detects a pressing force of the part of the human body against the sound generating unit, and
the volume of the vibration sound is changed corresponding to the pressing force.

7. The electronic device according to claim 6, wherein
the volume of the vibration sound increases as the pressing force increases, and
the volume of the vibration sound decreases as the pressing force decreases.

8. The electronic device according to claim 1, wherein
the detection unit detects a contact area of the part of the human body with the sound generating unit, and
the volume of the vibration sound is changed corresponding to a size of the contact area detected by the detection unit.

9. The electronic device according to claim 8, wherein
the volume of the vibration sound increases as the contact area increases, and
the volume of the vibration sound decreases as the contact area decreases.

10. The electronic device according to claim 2, wherein
the volume of the vibration sound is changed corresponding to a change in the contact position in a first direction, and
tone of the vibration sound is changed corresponding to a change in the contact position in a second direction.

11. The electronic device according to claim 10, wherein
the piezoelectric element is provided near an end in a longitudinal direction of the sound generating unit,
the first direction is the longitudinal direction of the sound generating unit, and
the second direction is a lateral direction of the sound generating unit.

12. The electronic device according to claim 1, wherein the vibrating region of the sound generating unit is larger than a region having a length corresponding to a distance between an inferior crus of antihelix and an antitragus of a human ear and a width corresponding to a distance between a tragus and an antihelix.

13. The electronic device according to claim 1, wherein the sound generating unit configures part of or the entire of any of a display panel, an operation panel, a cover panel, and a lid panel for enabling a rechargeable battery to be removable.

14. The electronic device according to claim 13, wherein
the sound generating unit is the display panel, and
the piezoelectric element is arranged outside of a display region for a display function of the display panel.

15. The electronic device according to claim 1, wherein deformation for transmitting an air conduction sound and a human body vibration sound is generated at any portion of the sound generating unit.

16. The electronic device according to claim 1, wherein the sound generating unit is vibrated by the piezoelectric element and generates an air conduction sound and the vibration sound.

17. A control method performed by an electronic device comprising a sound generating unit and a piezoelectric element, the control method comprising:
vibrating the sound generating unit with the piezoelectric element to cause the sound generating unit to generate a vibration sound to be transmitted while vibrating part of a human body;

detecting a contact range of the part of the human body with the sound generating unit;

determining whether the part of the human body is an ear based on the detected contact range; and changing a volume of the vibration sound corresponding to a detection result at the detecting when it is determined at the determining that the part of the human body is the ear, wherein the sound generating unit comprises a plurality of portions vibrated in a direction intersecting with a principal plane of the sound generating unit in a vibrating region thereof, and a value of an amplitude of the vibration is changed from positive to negative or vice versa with time, at each of the portions.

18. A non-transitory storage medium that stores a control program that causes, when executed by an electronic device comprising a sound generating unit and a piezoelectric element, the electronic device to execute:

vibrating the sound generating unit with the piezoelectric element to cause the sound generating unit to generate a vibration sound to be transmitted while vibrating part of a human body;

detecting a contact range of the part of the human body with the sound generating unit;

determining whether the part of the human body is an ear based on the detected contact range; and changing a volume of the vibration sound corresponding to a detection result at the detecting when it is determined at the determining that the part of the human body is the ear, wherein the sound generating unit comprises a plurality of portions vibrated in a direction intersecting with a principal plane of the sound generating unit in a vibrating region thereof, and a value of an amplitude of the vibration is changed from positive to negative or vice versa with time, at each of the portions.

19. The electronic device according to claim 1, further comprising:

a storage storing the changed volume, wherein the sound generating unit sets the volume of the vibration sound to the changed volume stored in the storage, when the detection unit again detects contact of the part of the human body with the sound generating unit within a predetermined time after a last detection of contact of the part of the human body with the sound generating unit.

20. The electronic device according to claim 2, further comprising:

a controller, wherein the controller changes, according to the contact position detected by the detection unit, the volume of the vibration sound by a degree greater than a degree of change in a magnitude of the vibration sound being caused by vibration of the piezoelectric element itself.

* * * * *